(12) United States Patent
Rezgui et al.

(10) Patent No.: US 7,772,874 B2
(45) Date of Patent: Aug. 10, 2010

(54) SINGLE EVENT TRANSIENT MITIGATION AND MEASUREMENT IN INTEGRATED CIRCUITS

(75) Inventors: Sana Rezgui, San Francisco, CA (US); John McCollum, Saratoga, CA (US); Jih-Jong Wang, San Jose, CA (US)

(73) Assignee: Actel Corporation, Mountain View, CA (US)

( * ) Notice: Subject to any disclaimer, the term of this patent is extended or adjusted under 35 U.S.C. 154(b) by 0 days.

(21) Appl. No.: 12/352,512

(22) Filed: Jan. 12, 2009

(65) Prior Publication Data

US 2009/0189634 A1    Jul. 30, 2009

Related U.S. Application Data

(60) Provisional application No. 61/024,146, filed on Jan. 28, 2008.

(51) Int. Cl.
*H03K 17/16* (2006.01)
(52) U.S. Cl. .......................... 326/21; 326/46
(58) Field of Classification Search .............. 326/21, 326/22, 26–28, 46
See application file for complete search history.

(56) References Cited

U.S. PATENT DOCUMENTS

| 6,573,773 B2 | 6/2003 | Maki et al. |
| 7,200,822 B1 * | 4/2007 | McElvain ............ 716/3 |

OTHER PUBLICATIONS

Co-pending U.S. Appl. No. 12/361,955, filed Jan. 29, 2009 entitled Single Event Transient Mitigation and Measurement in Integrated Circuits.

* cited by examiner

*Primary Examiner*—Don P Le
(74) *Attorney, Agent, or Firm*—Lewis and Roca LLP

(57) ABSTRACT

A method for single event transient filtering in an integrated circuit device is described. The device comprises three sequential elements, each having a data input and a data output with each of the three data outputs coupled to one of three inputs of a voting gate. The method comprises generating first and second nominally equivalent logic signals in first and second SET domains, converting the first and second nominally equivalent logic signals into first, second and third nominally equivalent data channels, and transmitting the first, second and third nominally equivalent data channels to the data inputs of the first, second and third sequential elements.

23 Claims, 20 Drawing Sheets

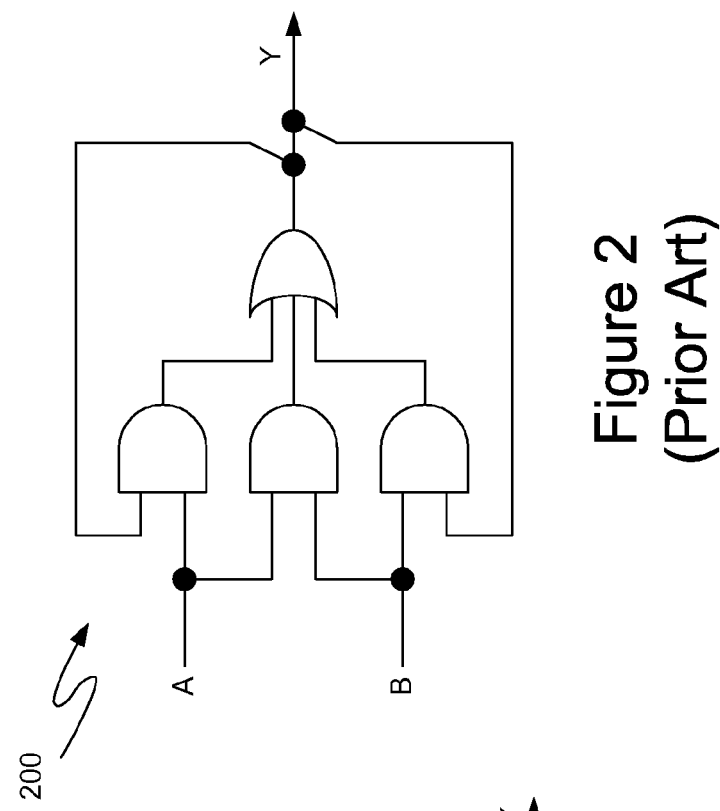
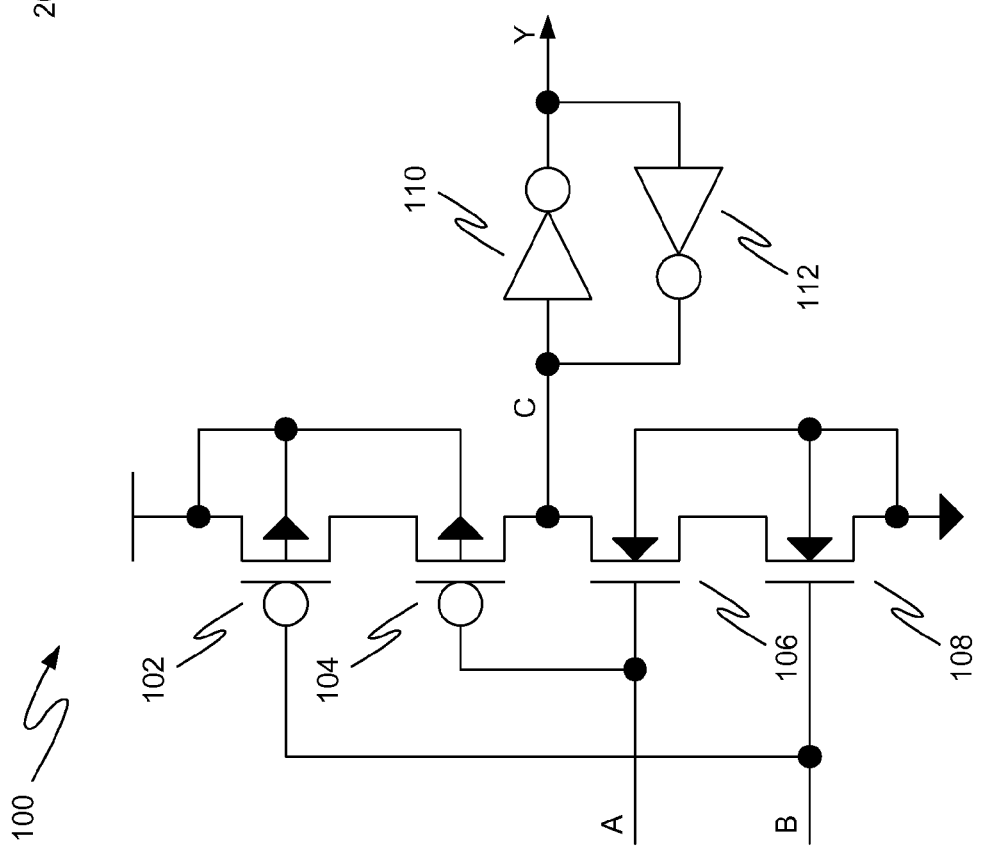
Figure 2
(Prior Art)
Figure 1
(Prior Art)

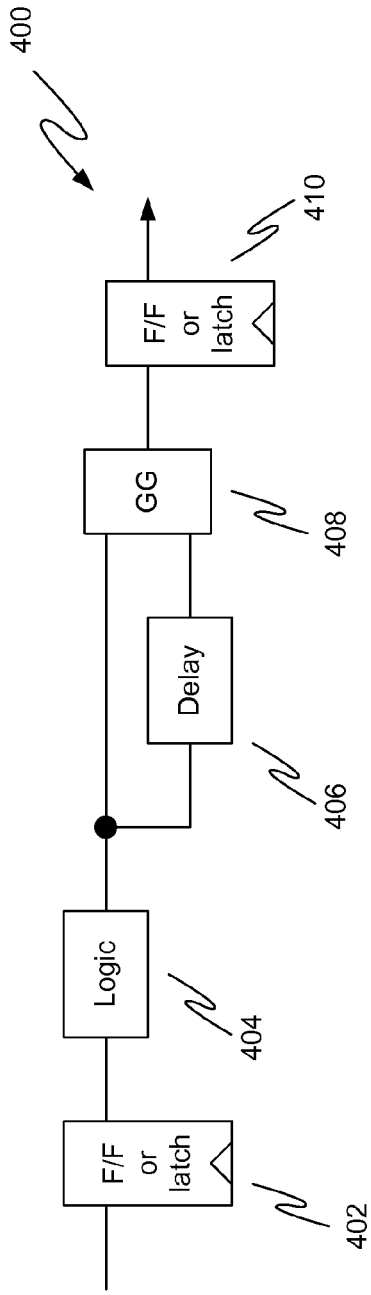
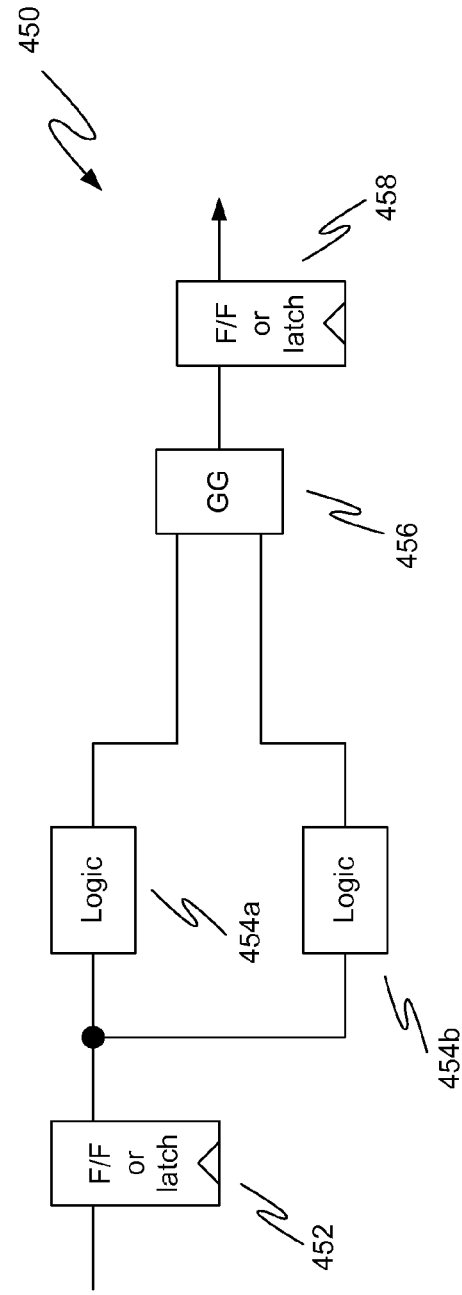
Figure 4A (Prior Art)
Figure 4B (Prior Art)

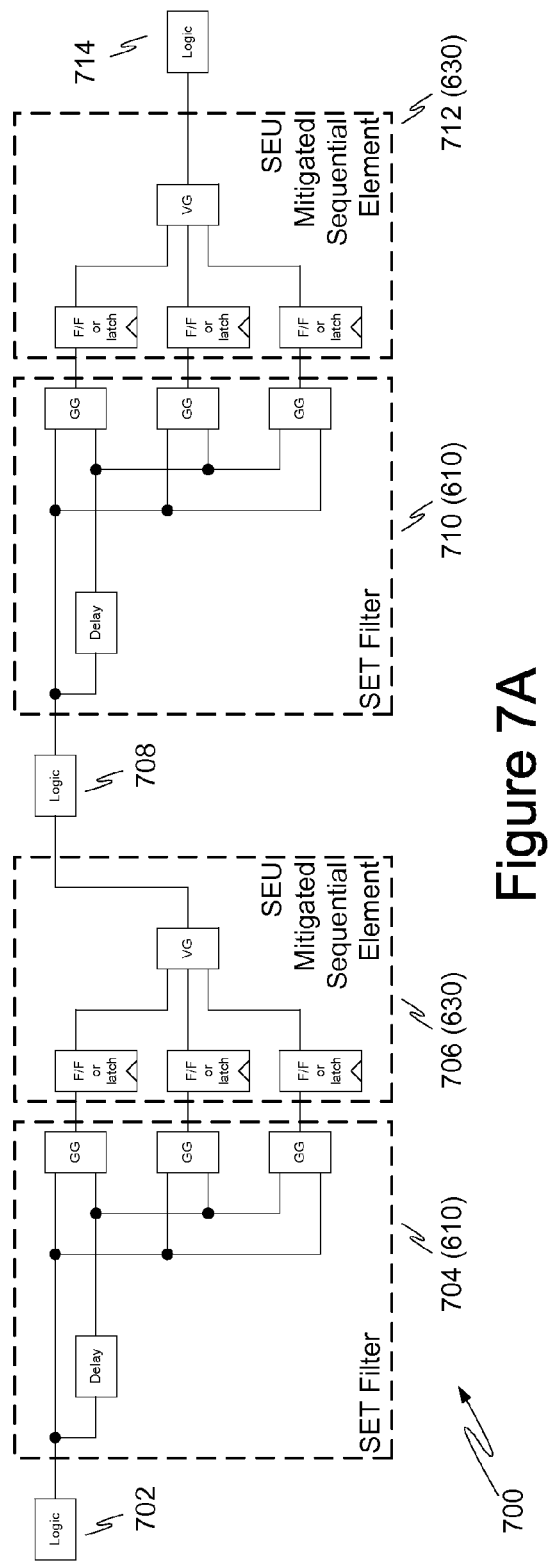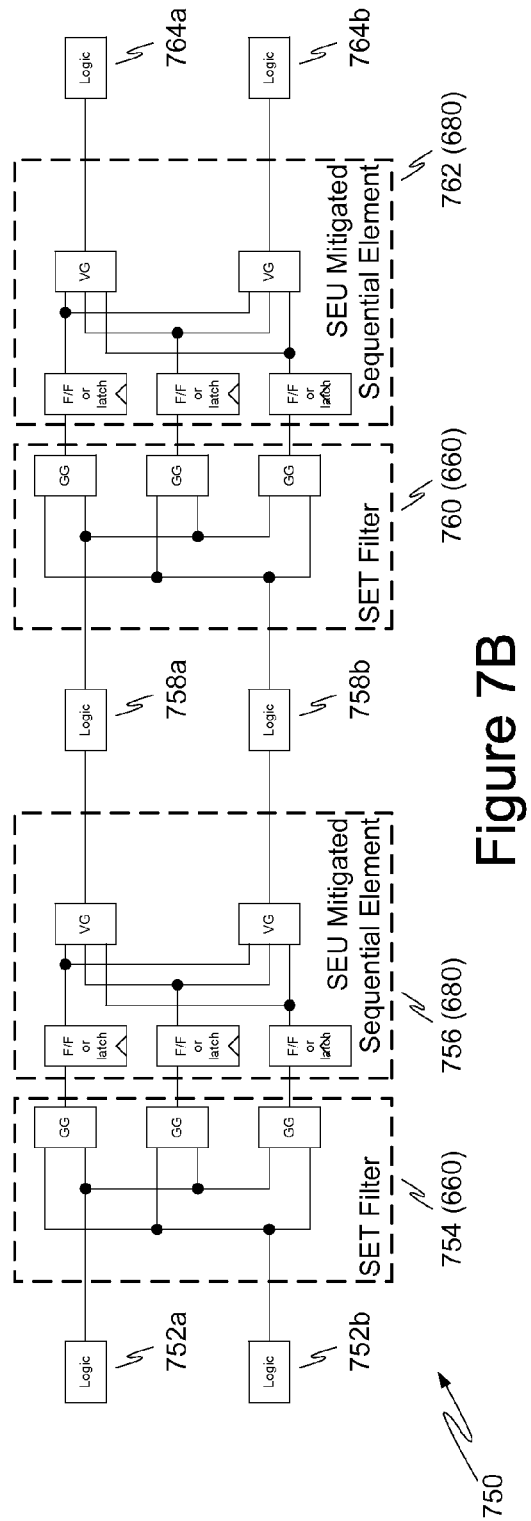
Figure 7A
Figure 7B

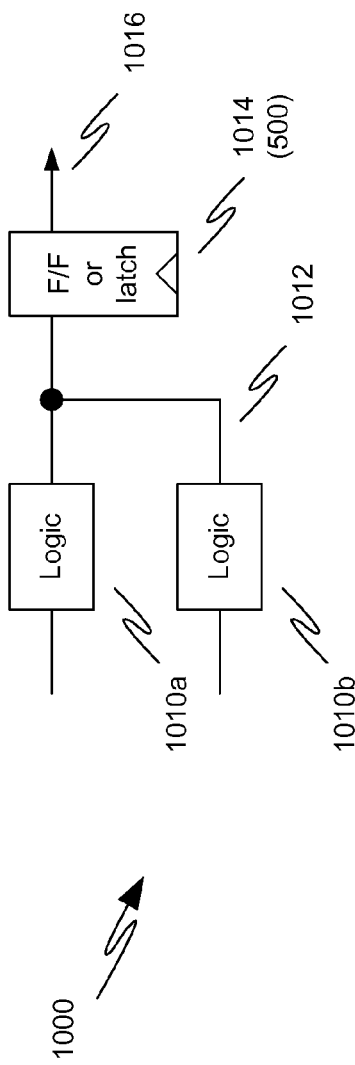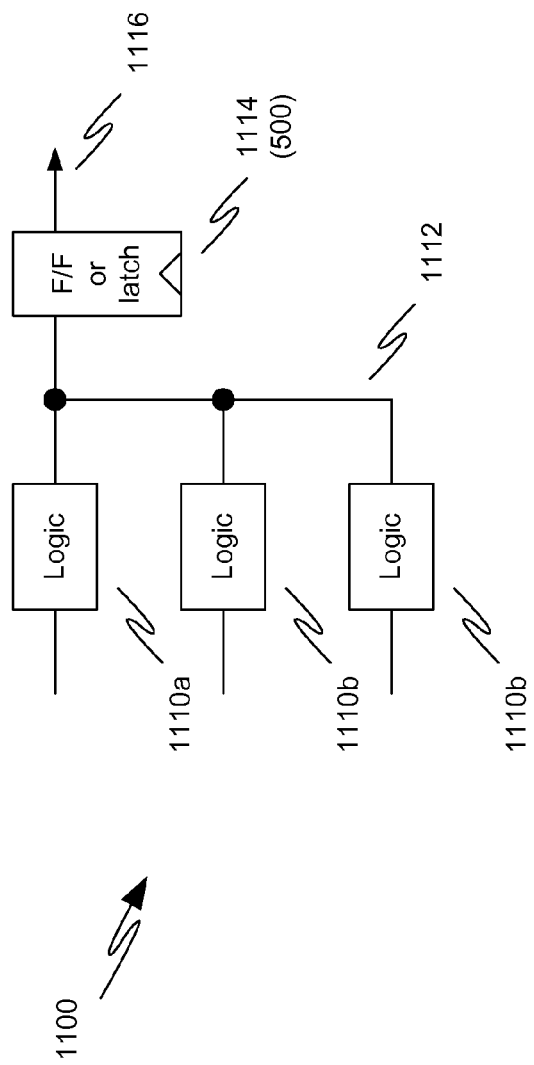

SINGLE EVENT TRANSIENT MITIGATION AND MEASUREMENT IN INTEGRATED CIRCUITS

REFERENCE TO RELATED APPLICATIONS

This application claims an invention that was disclosed in Provisional Application No. 61/024,146 filed Jan. 28, 2008, entitled "SET Mitigation and Measurement in Integrated Circuits." The benefit under 35 USC §119(e) of the United States provisional application is hereby claimed, and the aforementioned provisional application is hereby incorporated herein by reference.

BACKGROUND OF THE INVENTION

1. Field of the Invention

The invention pertains to the field of integrated circuits. More particularly, the invention pertains to radiation hardening of integrated circuit devices.

2. The Prior Art

CMOS integrated circuits are well known in the art and are used in thousands of different applications. It is also well known in the art that CMOS integrated circuits are vulnerable to a variety of radiation effects that make them unsuitable or unreliable for a variety of uses in the aerospace, space, and military fields without a degree of radiation hardening appropriate for the particular radiation environment anticipated for the application.

Some radiation effects like, for example, total ionizing dose, relate to physical damage sustained by the semiconductor structures due to charged particle impacts and are beyond the scope of this disclosure. Other classes of radiation effects like, for example, Single Event Effects (SEE), apply to logic errors induced during normal operation. As transistor feature sizes have scaled down, their critical charges for SEE have scaled down as well. As a consequence, SEE could affect both the sequential and combinational logic. In the case of sequential logic they are called Single Event Upsets (SEU), and in the case of combinational logic they are called Single Event Transients (SET).

When a charged particle strikes the semiconductor substrate in a CMOS integrated circuit during normal operation, it ionizes atoms along its trajectory, leaving a temporary surplus of charge carriers (hole and electron pairs) in its wake. If the particle passes through a first doped semiconductor region that is being driven to a voltage that is different than the voltage of a second surrounding and oppositely doped semiconductor region, the surplus carriers distort the normal shape of the depletion region separating (and usually electrically isolating) the two oppositely doped regions and current begins to flow in the direction of the electric field generated by the voltage difference between the two doped regions. This effect is known as a "Field Funnel." If the first doped region is a node in a logic circuit, the practical effect of a field funnel is to inject a substantial amount of extra charge onto the node that drives it towards the opposite logical state from where it should be. The driver driving the logic node will supply current to counteract the field funnel current, though its degree of success will depend on its ability to supply current, the circuit topology, and the amount of charge available in the funnel. The funnel will persist until all of its carriers have drifted onto the logic node or have diffused away and recombined in the second semiconductor region.

If the logic node is part of a feedback path, as in a sequential element such as a latch or flip/flop, then the driver driving the logic node must succeed in restoring the voltage on the logic node to the correct logic level before the radiation induced incorrect signal can propagate all the way around the feedback path or the wrong data will remain stored in the sequential element. This would be an example of an SEU. There are a variety of methods known in the art to mitigate SEUs. One way is to make the node drivers large enough so that the particle strike either does not cause a significant amount of voltage variation or the driver can source or sink enough current to restore the struck node to its original voltage value before the incorrect signal propagates around the feedback loop. Unfortunately, this typically requires drivers to be far larger than the minimum or near-minimum sized transistors that are desirable to use in logic circuits.

A second SEU mitigation technique is the so-called dice-cell that extends the basic latch feedback loop from two inverters to four stages of series PMOS and NMOS transistors while coupling the PMOS and NMOS gates to successive outputs in opposite directions around the loop. This prevents a particle strike from upsetting more than two of the four nodes in the cell and allows the cell to return to its correct stable state once the field funnel charge has been exhausted. An example of this approach can be found in FIG. 1 of U.S. Pat. No. 6,573,773 to Maki, et al.

A third common technique is Triple Module Redundancy (TMR). This approach is to build the same identical circuit (or module—the technique can be applied to any level of component in a system) three times and then comparing the three outputs by means of voting logic. If this is done for a single bit of sequential logic, the three outputs are connected to the inputs of a voting gate (sometimes known as a majority-of-three gate or MAJ3 gate or M3 gate where MAJ3(A,B,C)=M3(A,B,C)=AB+AC+BC in Boolean algebra) that produces an output in agreement with any two of the three inputs if the third input has a different logic value and an output in agreement with all three inputs if all have the same logic value.

A fourth technique, used in cases where a wide data word comprising multiple bits is employed, is to encode the data before storage with an error correction code (ECC) and then decode it before use. This is a very common approach in volatile memories like static random access memories (SRAMs) where the cost of the ECC circuits can be amortized over many bits.

Typically when SEE mitigation is attempted in the prior art, SEU mitigation is addressed first and then sometimes SET mitigation is attempted. A number of SET mitigation techniques are known in the art. FIG. 1 shows an analog guard gate 100 of the prior art. Typically guard gates are used to filter out SET pulses occurring on one of two different, nominally equivalent versions of a logic signal. The nominally equivalent versions of a logic signal (called "SET domains") are either generated by a duplication of the logic or by delaying the signal in time by some means. In either case, the logical value of the different versions will be identical except either immediately after a legitimate change in logic state or immediately after an SET. When inputs A and B are at the same logic state, guard gate 100 acts like a logical buffer. When inputs A and B are both at logic-1, the output of the first stage node C drives to logic-0 and the output of the second stage the node Y drives to logic-1. When inputs A and B are both at logic-0, node C drives to logic-1 and the output Y drives to logic-0. When inputs A and B are at different values (logic-0/1 or logic 1/0), one of the P-channel transistors 102 and 104 and one of the N-channel transistors 106 and 108 will be turned off presenting high impedance to the node C. The latch comprising inverters 110 and 112 will hold the last value on node Y until the transient has passed and inputs A and B are equal again. Thus when inputs A and B are coupled to nominally equivalent logic signals in two different SET domains like, for example, coupling A and B to either end of a delay element (not shown) or to the outputs of duplicated logic functions (not shown), the guard gate 100 will not respond to an SET induced transition on only one of the inputs A or B.

FIG. 2 shows a prior art digital guard gate 200. The basic operation is similar to the analog guard gate 100 of FIG. 1. This is the equivalent to a majority-of-3 or MAJ3 or voting gate with the output fed back and connected to one of the three inputs, in this case Y(A,B,Y)=AB+AY+BY. Here, if A=B=1 then Y=1; if A=B=0 then Y=0; and if A≠B then Y=Y. In other words, the output node Y is driven to the same logic state as inputs A and B when they are identical. When A and B are not identical, Y retains its previous value (by voting with the input of the same value to retain its state). Guard gate 200 could be substituted for guard gate 100 in many applications.

FIG. 3 shows a guard gate 302 similar to the guard gate 100 of FIG. 1 (transistors 102, 104, 106 and 108) with an RS-latch (NAND-gates 308 and 310) replacing the two inverter latch (inverters 110 and 112) in a configuration 300 used to measure the pulse widths of SET events. Guard gate 302 is combined with variable delay 304 to form an SET filter. The input of the SET filter is coupled to a target circuit 306, in this case a delay line 306 with its input coupled to ground (or logic-0). The output of the guard gate 302 is coupled to the RS-latch formed by NAND-gates 308 and 310. Driving the RESET signal to logic-0 forces the value logic-0 at the output node OUT, then RESET is returned to its normal value of logic-1. While the circuit waits for an SET to occur (typically in a particle beam inside a test chamber), nodes A and B are at logic-0, the node C is at logic-1, and the output node Y is at logic-0.

When the target 306 is struck by a particle of sufficient energy, a transient logic-1 may appear on node A. If the transient logic-1 on node A persists for longer than it takes for the variable delay 304 to propagate the logic-1 to node B, then guard gate 302 will output a logic-0 on node Y causing the RS-latch to transition to logic-1 where it will stay until a controller (not shown) notes the presence of the logic-1, logs it, and then resets the RS-latch to wait for another SET to occur.

Since the particle density and particle energy of the beam are known, by tabulating the number of SETs during a known test time as well as changing the value of the variable delay 304 from test to test, a great deal can be learned about the radiation performance of the target circuit 306. Of particular importance is correlating the widths of SET pulses with the energy of the particles generating them by experimentally varying the length of the variable delay 304 and the composition of the particle beam.

FIG. 4A shows a signal delay type SET filter of the prior art used in a configuration 400 for mitigating SET in an application specific integrated circuit (ASIC) logic design. Sequential elements 402 and 410 are latches or flip/flops (FFs) forming the beginning and end of a logical stage while logic circuit 404 forms the core of the logic stage. In a test design, logic circuit 404 would typically be a delay line with a single input and a single output (as shown), while in a logic design, logic circuit 406 typically would perform a number of Boolean functions and would have multiple inputs (not shown) and often have multiple outputs (not shown). If present, the multiple inputs and outputs would need to be radiation hardened in the same or similar manner. Delay element 406 and guard gate 408 form an SET filter with its input coupled to the logic circuit 404 and its output coupled to sequential element 410.

The circuit 400 filters out SET induced pulses created in the logic circuit 404 that are narrower than the length of the delay element 406.

It is assumed that the sequential element is mitigated in some way such as triple module redundancy (TMR) or dice cell or equivalent. Either guard gate 100 of FIG. 1 or guard gate 200 of FIG. 2 could be used as guard gate 408.

FIG. 4B shows a logic duplication type SET filter of the prior art used in a configuration 450 for mitigating SET in an application specific integrated circuit (ASIC) logic design. Sequential elements 452 and 458 are latches or flip/flops forming the beginning and end of a logical stage while nominally equivalent logic circuits 454a and 454b form the core of the logic stage. In a test design, logic circuits 454a and 454b would typically be delay lines with a single input and a single output (as shown), while in a logic design, logic circuits 454a and 454b typically would perform a number of Boolean functions and would have multiple inputs (not shown) and often multiple outputs (not shown). If present, the multiple inputs and outputs would need to be radiation hardened in the same or similar manner. Guard gate 456 forms an SET filter with its inputs coupled to the nominally equivalent outputs of logic circuits 454a and 454b and its output coupled to sequential element 458. The circuit 450 filters out SET induced pulses created in either one or the other of the logic circuits 454a and 454b. It is assumed that the sequential element is mitigated in some way such as triple module redundancy (TMR) or dice cell or equivalent. Either guard gate 100 of FIG. 1 or guard gate 200 of FIG. 2 could be used as guard gate 456.

FIG. 5 shows an SEU mitigated sequential element 500 of the prior art that is suitable for use in the circuits 400 and 450 in FIGS. 4A and 4B respectively. This is a TMR circuit, where the sequential elements (either flip/flops or latches) 502, 504 and 506 are tripled in parallel and then the three outputs are resolved by voting gate (or VG) 508. If a charged particle upsets the contents of one of the sequential elements, the voting gate 508 will filter out the anomalous result and present the correct value stored in the other two sequential elements to the circuit output 510. To be most effective, sequential elements 502, 504 and 506 must be physically separated by more than a distance known as the "double strike" distance. This will prevent a charged particle impacting the integrated circuit at a shallow angle relative to the surface from upsetting more than one of the latches at any given time. The chances of two sequential elements in SEU mitigated sequential element 500 being upset by two different charged particles is sufficiently small to be of no practical significance, so preventing a single particle from creating two SEUs in two related sequential elements is sufficient for virtually all purposes.

The primary weakness of the SEU mitigated element 500 of FIG. 5, and by extension the prior art SET filters 400 and 450 of FIGS. 4A and 4B respectively, is that the signal generated in the logic (404 in FIG. 4A and 454a/454b in FIG. 4B) is reduced to a single wire between the SET filter and the SEU mitigated sequential element. This makes the circuit vulnerable to a particle strike in either the guard gate (408 in FIG. 4A and 456 in FIG. 4B) or in the input stage of one of the flip/flops (502, 504 or 506 in FIG. 5). In a custom design this can be addressed by hardening the guard gate (408 in FIG. 4A and 456 in FIG. 4B), although this can consume considerable silicon area per guard gate. In an ASIC utilizing a standard cell library or a PLD utilizing logic modules, the logic function for the guard gate will be typically be available (or can be built from other library elements), but is most likely not available in a hardened version. Thus the need for an improved solution exists, particularly in hardening a design in a commercial ASIC or PLD for use in a radiation environment.

In general, if hardening is incorporated into a CMOS integrated circuit's sequential logic, SET can become the primary source of observable SEE. On application specific integrated circuits (ASICs) and non-volatile programmable logic devices (PLDs), two commonly used types of logic integrated circuits, SET effects can be "transient" if not captured by a memory cell. This is also true for volatile (SRAM based) PLDs, but the issue of hardening the memory elements containing the programming data against SEUs must be separately addressed. While the SET filtering techniques described herein are applicable to all CMOS integrated circuits, programmable or not, they are of particular interest to PLDs because they provide an extremely convenient measurement and experimentation vehicle for the investigation of radiation effects due to their programmable nature.

A PLD comprises a programmable logic block with any number of initially uncommitted logic modules arranged in an array along with an appropriate amount of initially uncommitted routing resources. Logic modules are circuits that can be configured to perform a variety of logic functions like, for example, AND-gates, OR-gates, NAND-gates, NOR-gates, XOR-gates, XNOR-gates, inverters, multiplexers, adders, latches, and flip/flops. Routing resources can include a mix of components such as wires, switches, multiplexers, and buffers. Logic modules, routing resources, and other features like, for example, I/O buffers and memory blocks, are the programmable elements of the PLD.

The programmable elements have associated control elements (sometimes known as programming bits or configuration bits) that determine their functionality. The control elements may be thought of as binary bits having values such as on/off, conductive/non-conductive, true/false, or logic-1/logic-0 depending on the context. The control elements vary according to the technology employed and their mode of data storage may be either volatile or non-volatile. Volatile control elements, such as SRAM bits, lose their programming data when the PLD power supply is disconnected, disabled or turned off. Non-volatile control elements, such as antifuses and floating gate transistors, do not lose their programming data when the PLD power supply is removed. Some control elements, such as antifuses, can be programmed only one time and cannot be erased. Other control elements, such as SRAM bits and floating gate transistors, can have their programming data erased and may be reprogrammed many times. The detailed circuit implementation of the logic modules and routing resources can vary greatly and is appropriate for the type of control element used.

Like most integrated circuits, PLDs typically have an input/output (I/O) ring surrounding a central core, though other approaches are possible. The I/O ring contains the input and output buffers that interface to circuits external to the PLD as well as the power supply and ground connections. Some of the input and output buffers are typically dedicated to control functions. Others are programmable elements that can be part of an end user's complete design. It is common for the programmable element inputs and outputs (also called user inputs or user input buffers and user outputs or user output buffers) to pair equal numbers of input buffers and output buffers together to form input/output buffers (also called I/O buffers or user I/O buffers or user I/Os or sometimes simply I/Os). In some PLDs, one or more of the inputs, outputs, or I/Os can be shared between user design functions and control functions.

In a pure PLD, the central core contains a programmable logic block comprising the majority of the programmable elements and control elements. The programmable logic block also typically contains a variety of control circuits. There may be other control circuits present either inside the central core or inside the I/O ring or divided between the central core and the I/O ring. This control circuitry handles various tasks such as testing the PLD functionality, programming the control elements, or transitioning the PLD from one mode of operation to another. In a hybrid PLD, there are typically other function blocks available to the user during normal operation such as central processing units, digital signal processors, custom logic blocks, and large volatile or non-volatile memory blocks. In some cases, the programmable logic block may be a minority of the total central core circuitry.

An end user's PLD design is typically implemented by use of a computer program product (also known as software or, more specifically, design software) produced by the PLD manufacturer and distributed by means of a computer-readable medium such as providing a CD-ROM to the end user or making the design software downloadable over the internet. Typically the manufacturer supplies a library of design elements (also known as library elements) as part of the computer program product. The library design elements provide a layer of insulation between the end user and the circuit details of the programmable elements, control elements, and the other PLD features available to the end user. This makes the design software easier to use for the end user and simplifies the manufacturer's task of processing the end user's complete design by the various tools in the design software.

BRIEF DESCRIPTION OF THE DRAWING FIGURES

FIG. 1 shows an analog guard gate of the prior art.
FIG. 2 shows a digital guard gate of the prior art.
FIG. 3 shows a technique used for characterizing SET events in ASIC logic components in the prior art.
FIG. 4A shows a first SET filtering technique used in the prior art.
FIG. 4B shows a second SET filtering technique used in the prior art.
FIG. 5 shows an SEU mitigated sequential element of the prior art.
FIG. 6A shows a first SET filter and sequential element according to the present invention.
FIG. 6B shows a second SET filter and sequential element according to the present invention.
FIG. 7A shows an application of the SET filter of FIG. 6A.
FIG. 7B shows an application of the SET filter of FIG. 6B.
FIG. 8A shows a third SET filter and sequential element according to the present invention.
FIG. 8B shows a fourth SET filter and sequential element according to the present invention.
FIG. 9 shows a fifth SET filter and sequential element according to the present invention.
FIG. 10 shows a sixth SET filter and sequential element according to the present invention.
FIG. 11 shows a seventh SET filter and sequential element according to the present invention.
FIG. 12 shows an eighth SET filter and sequential element according to the present invention.
FIG. 13A shows a first radiation test apparatus.
FIG. 13B shows a second radiation test apparatus.
FIG. 13C shows a third radiation test apparatus.

Figure 15A:
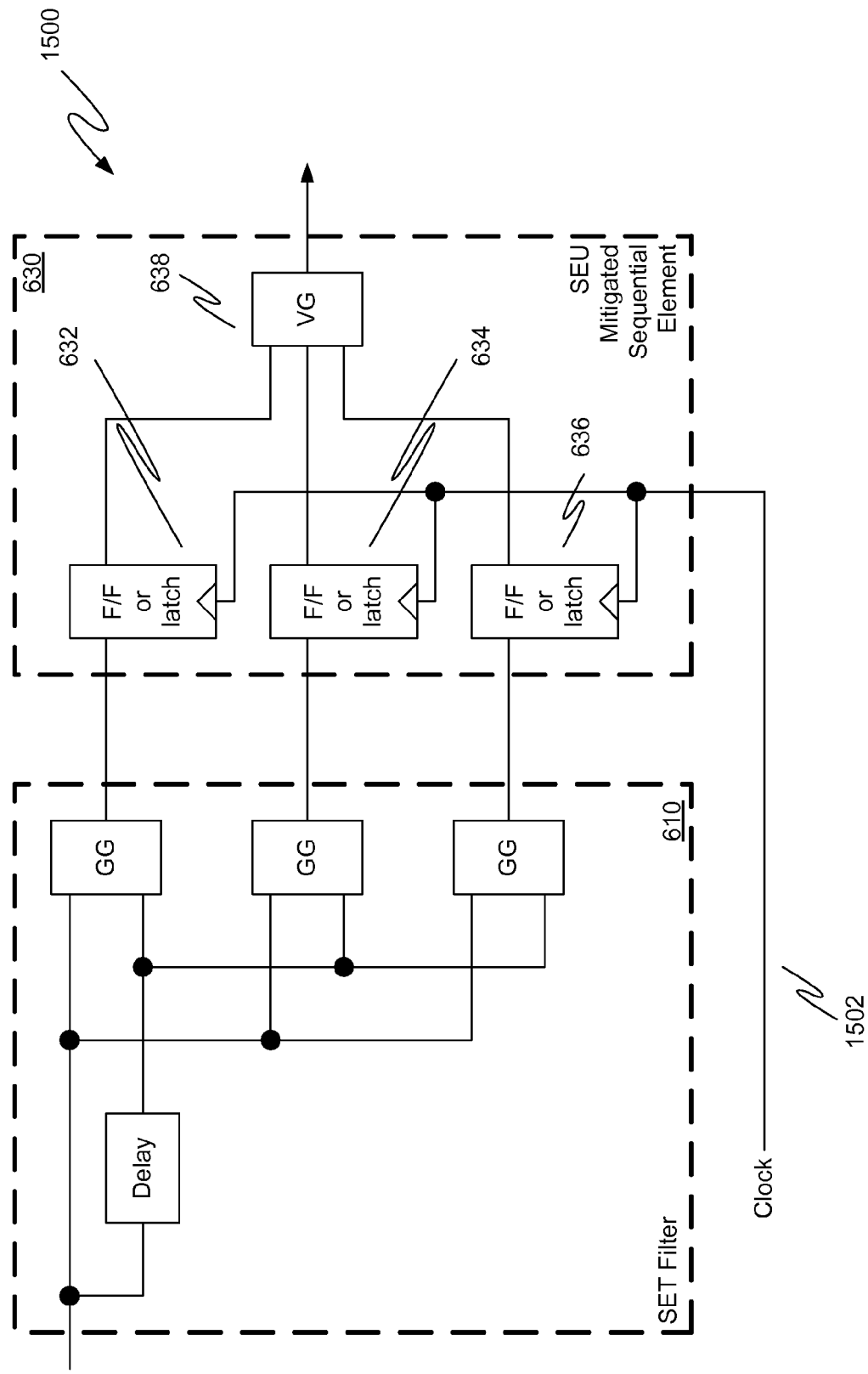
Figure 15B:
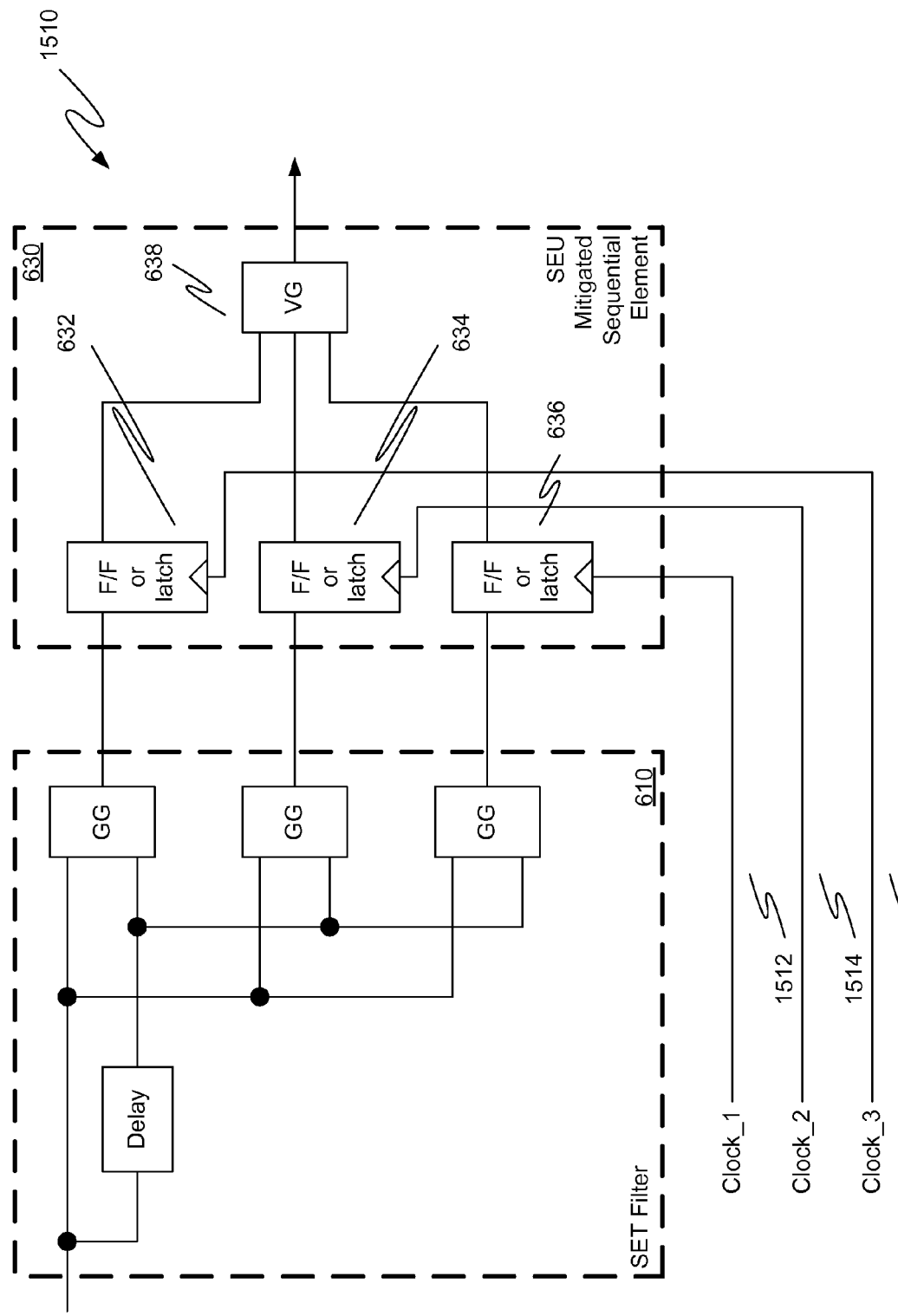
Figure 15C:
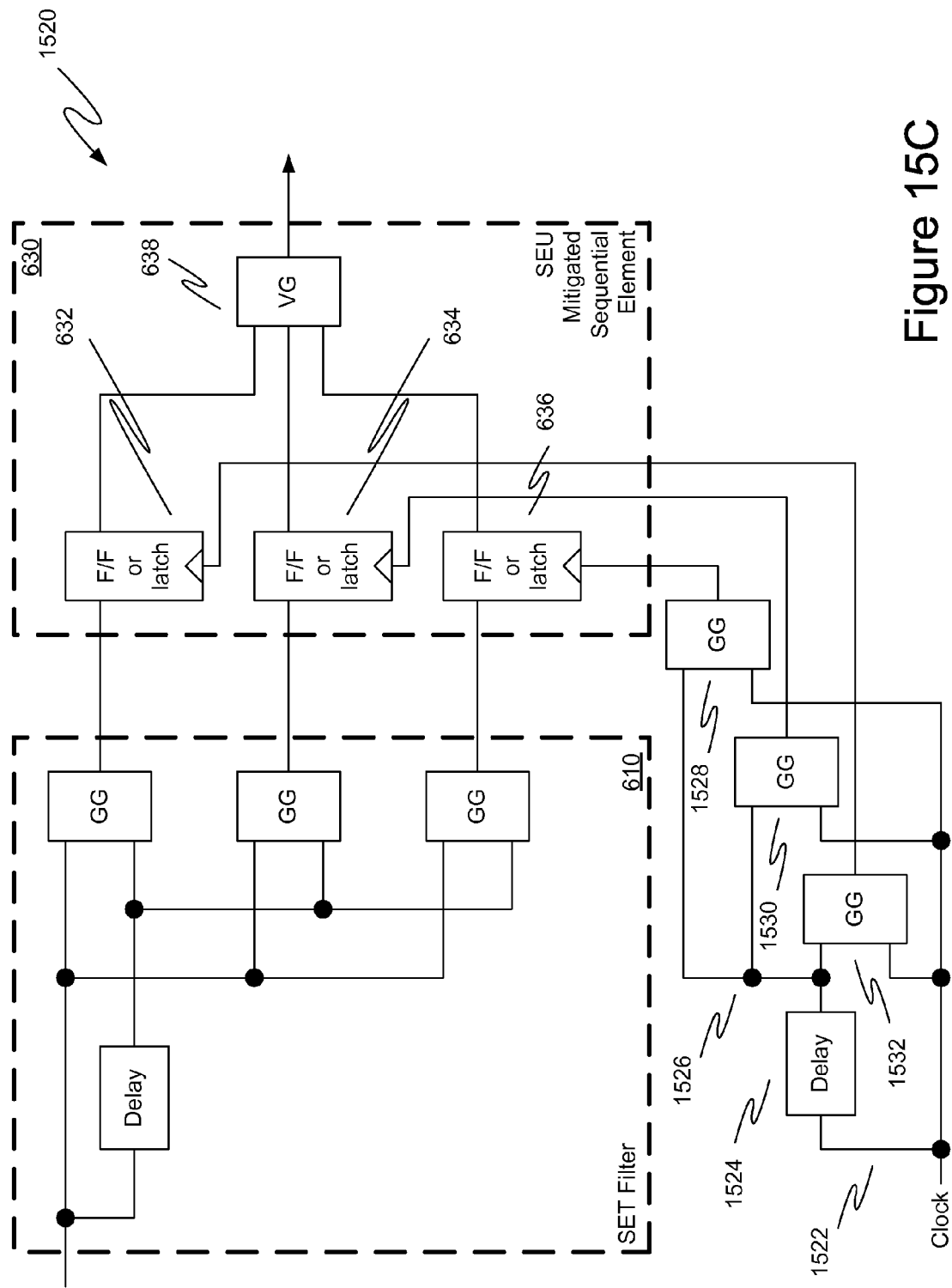
Figure 15D:
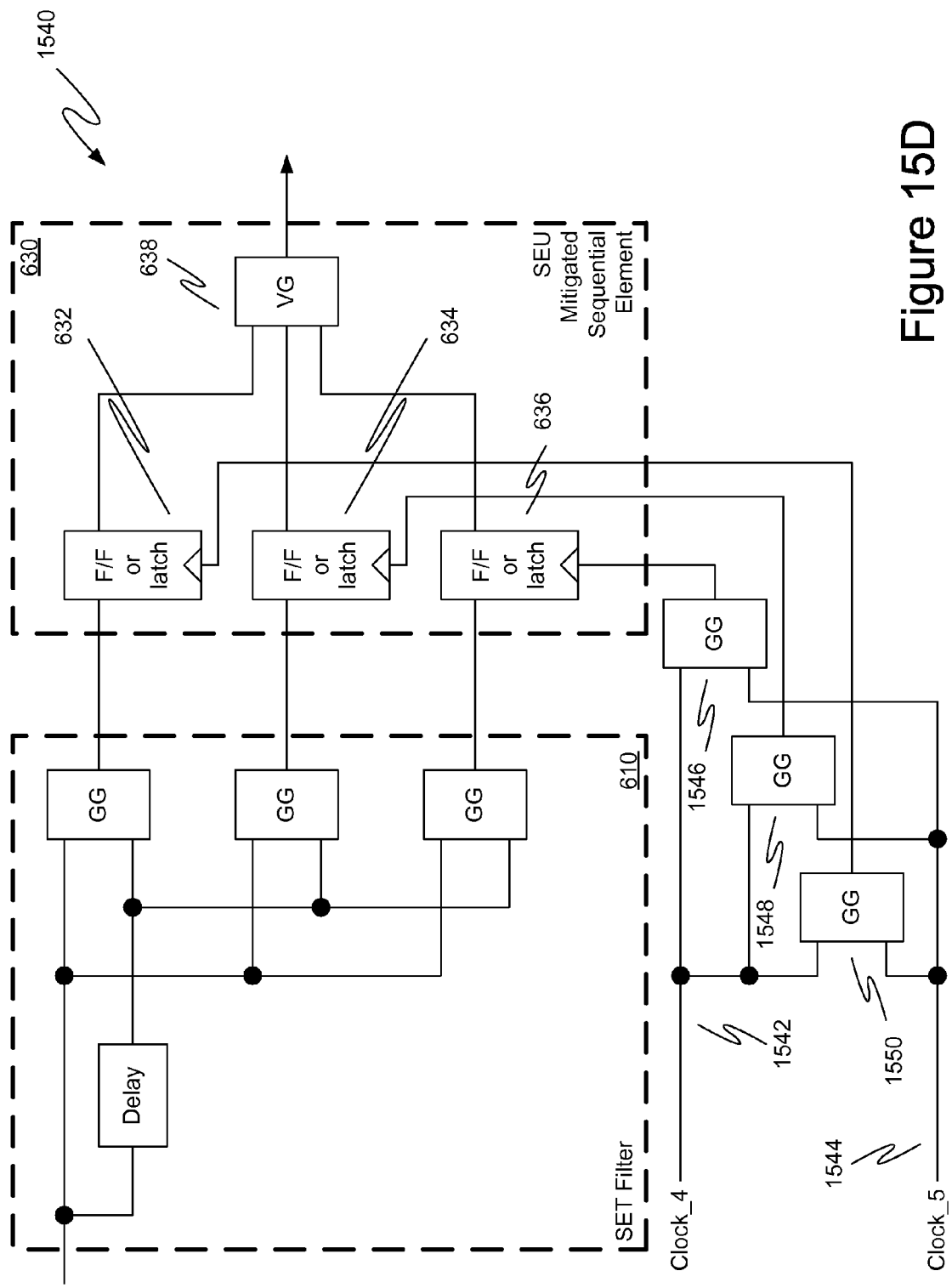

FIG. 15A shows a first SET mitigated clocking scheme.
FIG. 15B shows a second SET mitigated clocking scheme.
FIG. 15C shows a third SET mitigated clocking scheme.
FIG. 15D shows a fourth SET mitigated clocking scheme.

DETAILED DESCRIPTION OF THE INVENTION

Persons of ordinary skill in the art will realize that the following description of the present invention is illustrative only and not in any way limiting. Other embodiments of the invention will readily suggest themselves to such skilled persons.

For purposes of this specification, nominally equivalent logic signals are output signals from different circuits each implementing the same Boolean function of the same input variables. The input variables to the different circuits need not be the same exact set of input signals, if the input variables themselves are present as sets of nominally equivalent logic signals. Two nominally equivalent logic signals would always have the same value in an ideal static situation like, for example, if the input variables never change and there is no radiation present. In normal operation, nominally equivalent logic signals may have different values for short periods of time due to logic transitions and particle strikes. Two nominally equivalent logic signals are in two different SET domains if they are generated by different circuits designed so that a particle of less than the desired energy cannot generate a SET event simultaneously on both of the nominally equivalent logic signals. The differences between two SET domains can be spatial (generating the nominally equivalent logic signals in different locations, for example, by duplicating a logic function), temporal (generating the nominally equivalent logic signals at different times, for example, by using a delay line), or both.

Figure 6A:
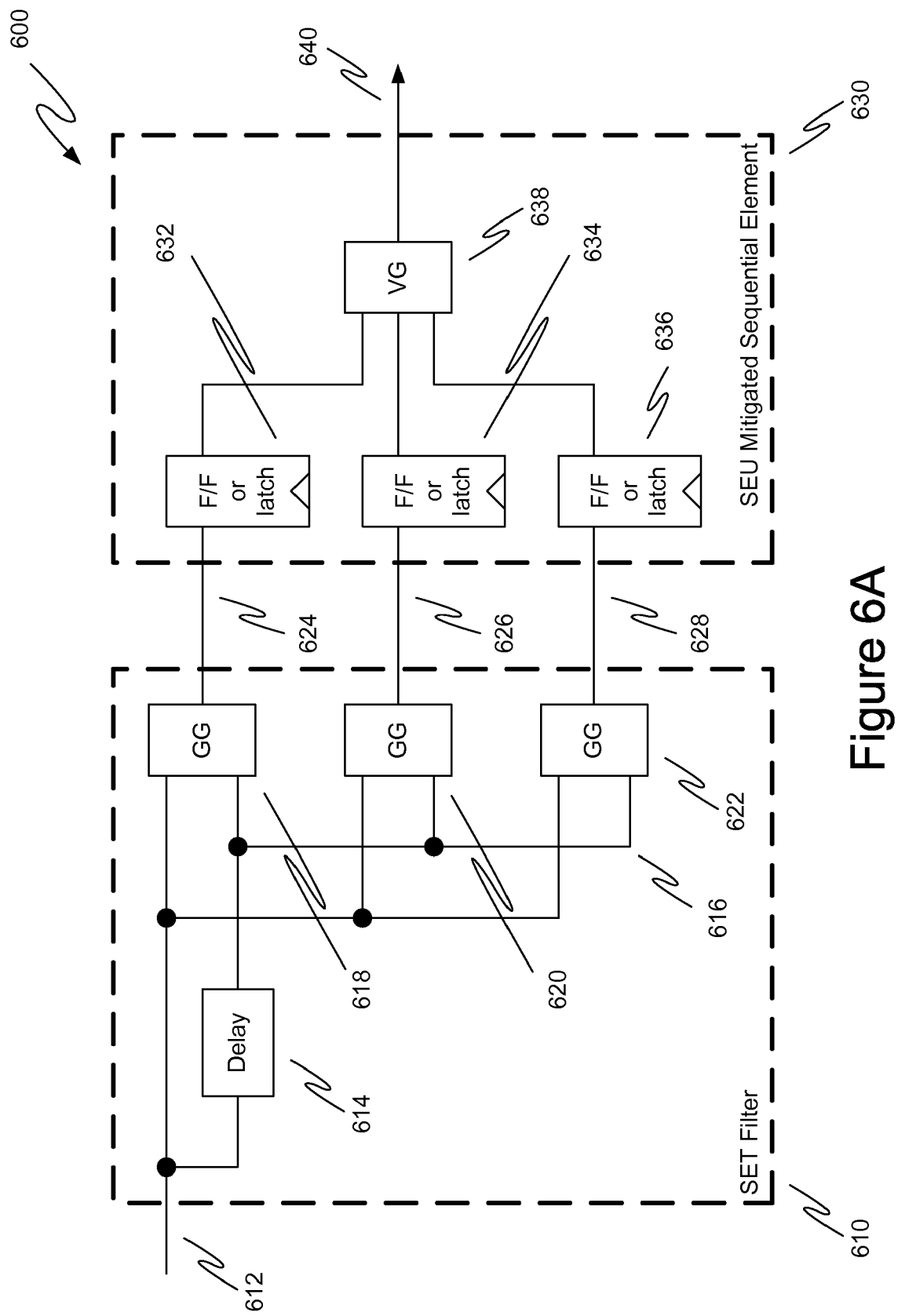

FIG. 6A shows, as generally indicated by reference number 600, a circuit comprising a first SET filter circuit 610 and a first SEU mitigated sequential element circuit 630 according to the present invention. SET filter 610 comprises an input interconnect 612 for a first nominally equivalent logic signal, a delay element 614, an interconnect 616 for a second nominally equivalent logic signal, guard gates 618, 620 and 622, and three output interconnects 624, 626 and 628. Input interconnect 612 is coupled to the input of delay element 614 and a first input on each of the three guard gates 618, 620 and 622. Interconnect 616 is coupled to the output of delay element 614 and a second input on each of the three guard gates 618, 620 and 622. The outputs of each of the three guard gates 618, 620 and 622 are coupled to output interconnects 624, 626 and 628 respectively creating three nominally equivalent data channels that are coupled to sequential elements 632, 634 and 636 respectively. For purposes of this specification, a data channel couples an output of a SET filter circuit to its corresponding input on an SEU mitigated sequential element circuit. Data channels are nominally equivalent logic signals with respect to each other and may be nominally equivalent to other logic signals present in the circuit. In this embodiment, interconnects 612, 616, 624, 626 and 628 are all nominally equivalent logic signals.

Delay element 614 generates the second nominally equivalent logic signal on interconnect 616 in response to the first nominally equivalent logic signal on interconnect 612. When interconnect 612 transitions to logic-1 from logic-0 (or from logic-0 to logic-1), a transition from logic-1 to logic-0 (or from logic-0 to logic-1) will appear on interconnect 616 after the amount of time delay element 614 introduces. This means that the logic signals require the extra time necessary to propagate from the logic through delay element 614 and the three parallel guard gates 618, 620 and 622 to the sequential element 630, and the additional delay degrades the timing performance of the circuit. However, due to the action of the guard gates, a transient signal of shorter duration than the delay of delay element 614 generated by a particle strike in the logic will not propagate to the SEU mitigated sequential element 630. The signals on interconnects 612 and 616 are nominally equivalent because they each correspond to the same Boolean function. They are in different SET domains because they are generated by different circuits at different times and are separate entities with respect to SET events. It is worth noting that an SET induced pulse originating one of the guard gates 618, 620 or 622 will only affect at most one of the three data channels and be filtered out by SEU mitigated sequential element 630.

In general, the higher the energy level of a charged particle the longer an SET pulse it will produce in a given CMOS circuit. Persons of ordinary skill in the art will appreciate that the correct amount of delay to be provided by delay element 614 is a matter of design choice and will be a function of a number of factors like, for example, the semiconductor process employed, the radiation environment (i.e., the particle energy levels) in which an application is intended to be operated, and the expected duration of SET pulses generated in the device by the particle energies in the surrounding environment.

SEU mitigated sequential element 630 comprises three sequential elements 632, 634 and 636 and voting gate (VG) 638. The data outputs of sequential elements 632, 634 and 636 are coupled to first, second and third inputs on voting gate 638 respectively and the output of voting gate 638 is coupled to the sequential element output interconnect 640. Instead of being coupled together as in SEU mitigated sequential element 500, the three data inputs of sequential elements 632, 634 and 636 are separated and coupled to the three data channels formed by interconnects 624, 626 and 628 respectively.

The circuit 600 mitigates both SET and SEU events. SET filter 610 generates three nominally equivalent data channels that are transmitted separately to the three sequential elements in SEU mitigated sequential element 630, providing a complete SEE hardened solution for the signal on interconnect 612. By replacing every sequential element in a design with circuit 600, the entire design is hardened against SEE.

Figure 6B:
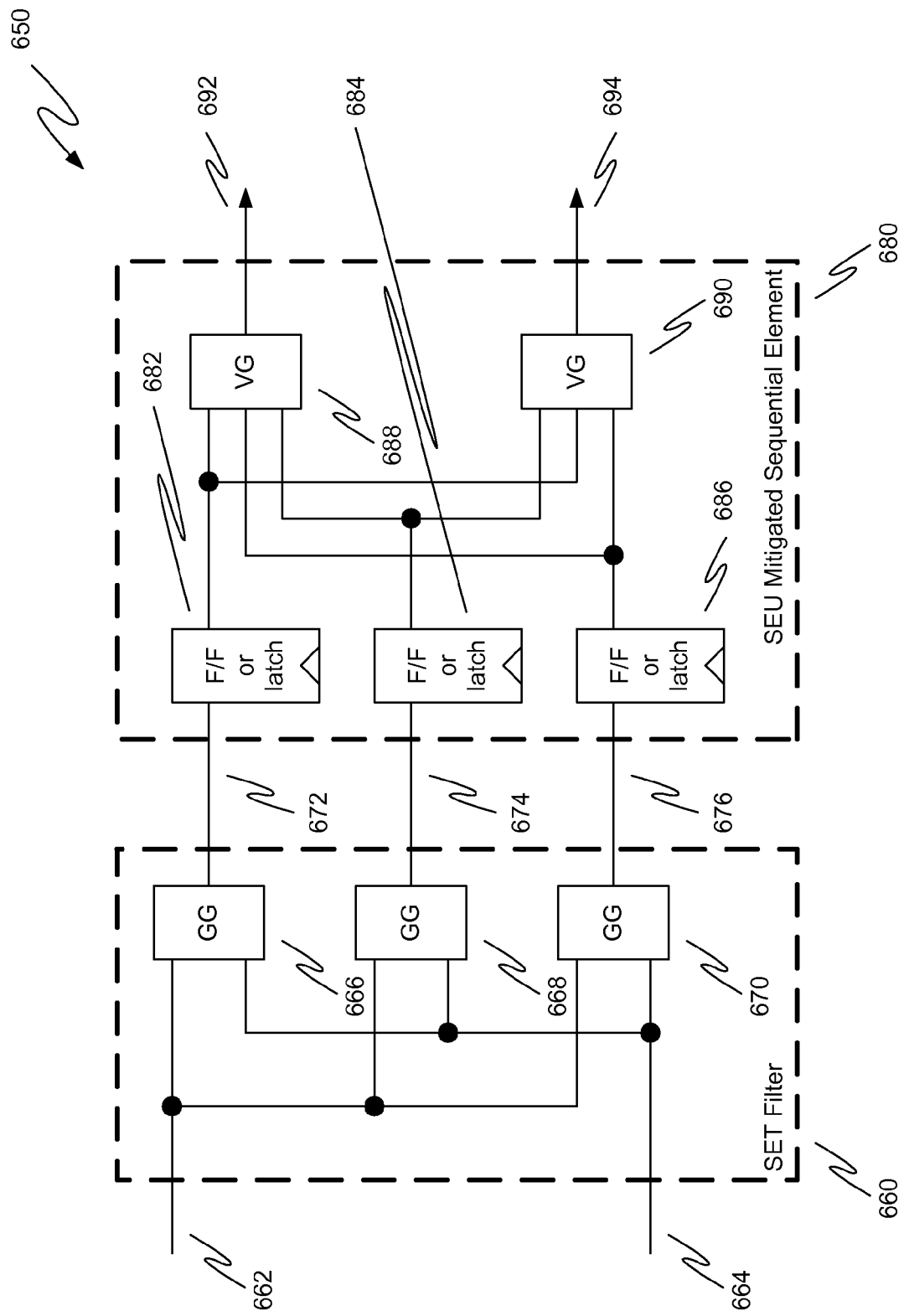

FIG. 6B shows, as generally indicated by reference number 650, a circuit comprising a second SET filter 660 and a second sequential element 680 according to the present invention. Set filter 660 comprises input interconnects 662 and 664 for first and second nominally equivalent logic signals, guard gates 666, 668 and 670, and three output interconnects 672, 674 and 676. Input interconnect 662 is coupled to a first input on each of the three guard gates 666, 668 and 670 while interconnect 664 is coupled to a second input on each of the three guard gates 666, 668 and 670. The outputs of each of the three guard gates 666, 668 and 670 are coupled to output interconnects 672, 674 and 676 respectively creating three nominally equivalent data channels. In this embodiment, interconnects 662, 664, 672, 674 and 676 are all nominally equivalent logic signals.

The two nominally equivalent logic signals on interconnects 662 and 664 are generated external to the SET filter 660 by duplicated logic circuits (not shown). Thus both interconnects 662 and 664 will transition to logic-1 from logic-0 (or from logic-0 to logic-1) at approximately the same time. This means that no extra time for a delay element is necessary as in SET filter 610 which improves circuit performance at the cost of duplicating the logic function. The signals on interconnects 662 and 664 are nominally equivalent because they each correspond to the same Boolean function. They are in different SET domains because they are generated by different logic circuits in different locations and are separate entities with respect to SET events.

SEU mitigated sequential element 680 is similar to SEU mitigated sequential element 630 of FIG. 6A. SEU mitigated sequential element 680 comprises three sequential elements 682, 684 and 686 and two voting gates 688 and 690. The data outputs of sequential elements 682, 684 and 686 are coupled to first, second and third inputs respectively on voting gates 688 and 690. The output of voting gate 688 is coupled to the sequential element output interconnect 692 and the output of voting gate 690 is coupled to the sequential element output interconnect 694. Instead of being coupled together as in SEU mitigated sequential element 500, the three data inputs of sequential elements 682, 684 and 686 are separated and coupled to interconnects 672, 674 and 676 respectively.

The circuit 650 mitigates both SET and SEU events. SET filter 660 generates three nominally equivalent data channels that are transmitted separately to the three sequential elements in SEU mitigated sequential element 630, providing a complete SEE hardened solution for an output to a logic circuit. By replacing every sequential element in a design with circuit 600 and duplicating the logic where necessary, the entire design is hardened against SEE. Since SET filter 660 is a logic duplication SET filter, the presence of two voting gates 688 and 690 (for the duplicated logic in the next logic stage) provides for more robust SET mitigation since a particle strike must hit both voting gates to affect both of the duplicated logic circuits in the next stage. Thus best results will be obtained if, like the three sequential elements 682, 684 and 686, the two guard gates 688 and 690 are physically placed more than the double strike distance apart.

It is worth noting that while interconnects 692 and 694 are logically equivalent logic signals with respect to each other, they are not logically equivalent with respect to interconnects 662, 664, 672, 674 and 676, even though the data on interconnects 662, 664, 672, 674 and 676 at any given time will appear on interconnects 692 and 694 after SEU mitigated sequential element 680 is clocked (by a clocking circuit not shown). This is because if the circuit were stopped after being clocked (i.e., putting the circuit in static mode), the signal on interconnects 662, 664, 672, 674 and 676 would reflect the new output of the logic (not shown) coupled to interconnects 662 and 664 due to the new input values that would be present after the upstream sequential elements were clocked.

FIG. 7A shows an application 700 of the SET filter 610 and SEU mitigated sequential element 630 of FIG. 6A. Shown are a series arrangement of a first logic circuit 702 with its output coupled to the input of SET filter 704 that is an instance of SET filter 610 of FIG. 6A. The three output channels of SET filter 704 (610) are each coupled to one of the three inputs of SEU mitigated sequential element 706 that is an instance of SEU mitigated sequential element 630. The output of SEU mitigated sequential element 706 (630) is coupled to the input of a second logic circuit 708 whose output in turn is coupled to the input of a second SET filter 710 that is a second instance of SET filter 610. The three output channels of SET filter 710 (610) are each coupled to one of the three inputs of SEU mitigated sequential element 712 that is a second instance of SEU mitigated sequential element 630. The output of SEU mitigated sequential element 712 (630) is coupled to the input of a third logic circuit 714.

Each of the three logic circuits 702, 708 and 714 shown in FIG. 7A may implement the same or a different Boolean function relative to each other. In a test circuit for radiation measurement or characterization, each of the three logic circuits 702, 708 and 714 might implement a long delay line of either inverting or non-inverting sub-delay elements, while in an SET and SEU mitigated logic design three different Boolean functions would be the most common case. Persons skilled in the art will realize that the three logic circuits 702, 708 and 714 are shown with a single input and a single output for clarity of presentation and to avoid cluttering the diagram and obscuring the inventive elements therein. In an SET and SEU mitigated logic design, multiple inputs and outputs is a common case, and such skilled persons will appreciate that a logic circuit such as logic circuit 708 with multiple inputs and outputs would require an SET filter 610 and an SEU mitigated sequential element 630 pair on each input and each output configured as shown in FIG. 7A.

FIG. 7B shows an application 750 of the SET filter 660 and SEU mitigated sequential element 680 of FIG. 6B. Shown are a series arrangement of a first pair of logic circuits 752a and 752b with their outputs each coupled to one of the inputs of SET filter 754 that is an instance of SET filter 660 of FIG. 6B. The three output channels of SET filter 754 (660) are each coupled to one of the three inputs of SEU mitigated sequential element 756 that is an instance of SEU mitigated sequential element 680. The two outputs of SEU mitigated sequential element 756 (680) are each coupled to a different one of the inputs of a second pair of logic circuit 758a and 758b whose outputs in turn are each coupled to one of the inputs of a second SET filter 760 that is a second instance of SET filter 660. The three output channels of SET filter 760 (660) are each coupled to one of the inputs of SEU mitigated sequential element 762 that is a second instance of SEU mitigated sequential element 680. The outputs of SEU mitigated sequential element 762 (680) are coupled to the inputs of a third pair of logic circuits 764a and 764b.

Logic circuits 752a and 752b both implement the same Boolean function. Logic circuits 758a and 758b also both implement the same Boolean function, but it may or may not be the same Boolean function that is implemented by logic circuits 752a and 752b.Similarly, logic circuits 764a and 764b both implement the same Boolean function, but it may or may not be the same Boolean function implemented by logic circuits 752a and 752b or by logic circuits 782a and 782b.The actual Boolean functions implemented will be a function of the application. In a test circuit for radiation measurement or characterization, each of the three logic circuits 752a, 752b, 758a, 758b, 764a and 764b might implement a long delay line of either inverting on non-inverting sub-delay elements, while in an SET and SEU mitigated logic design three different Boolean functions for each pair of logic circuits (the pair 752a and 752b, the pair 758a and 758b, and the pair 764a and 764b) would be the most common case. Persons skilled in the art will realize that the logic circuits 752a, 752b, 758a, 758b, 764a and 764b are shown with a single input and a single output. In an SET and SEU mitigated logic design, multiple inputs and outputs is a common case, and such skilled persons will appreciate that a logic circuit such as logic circuit 708 with multiple inputs and outputs would require an SET filter 610 and an SEU mitigated sequential element 630 pair on each input and each output configured as shown in FIG. 7B.

Figure 8A:
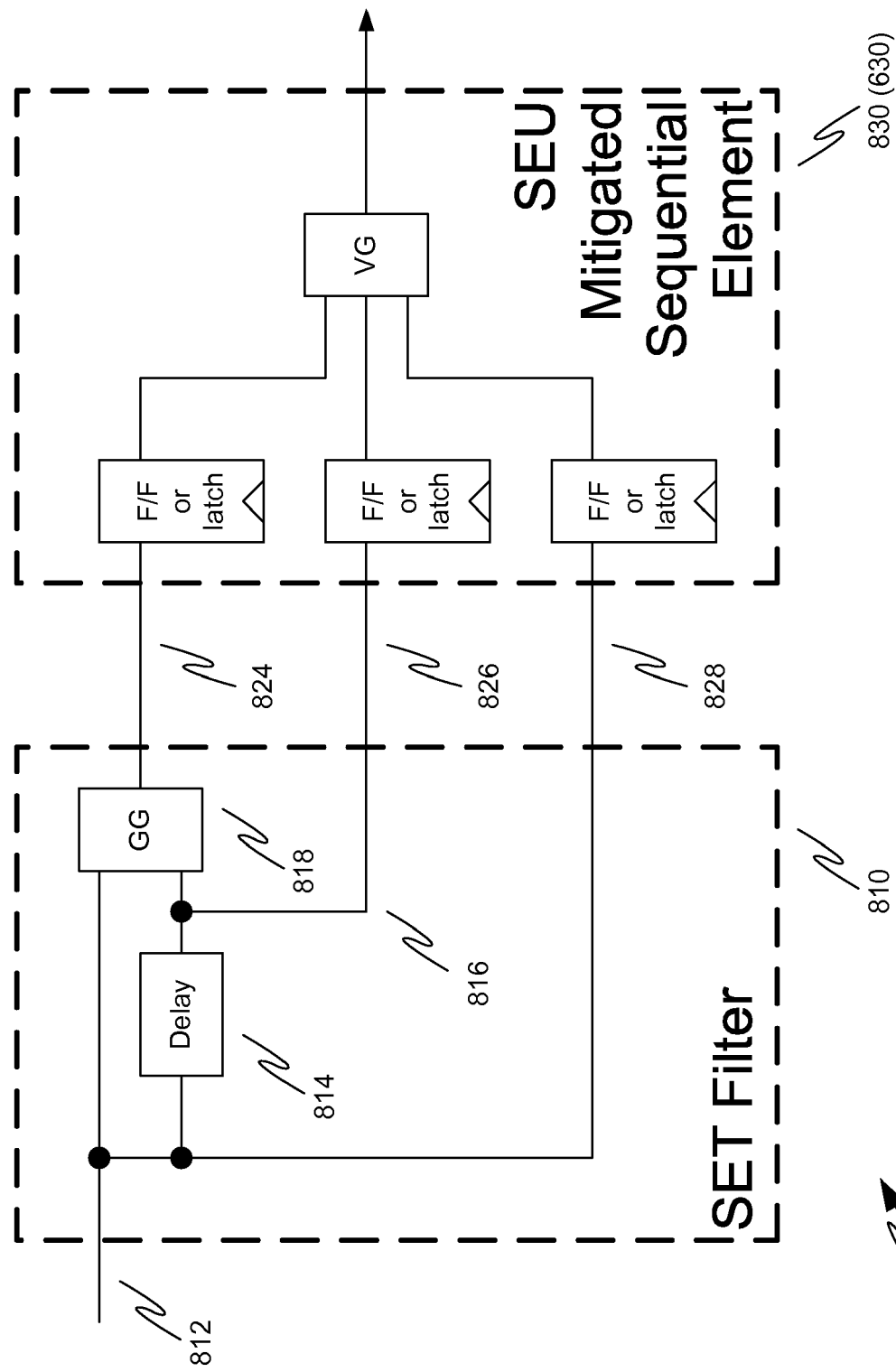

FIG. 8A shows, as generally indicated by reference number 800, a circuit comprising a third SET filter 810 and SEU mitigated sequential element 830 according to the present invention. SET filter 810 comprises an input interconnect 812 for a first nominally equivalent logic signal, a delay element 814, an interconnect 816 for a second nominally equivalent logic signal, guard gate 818, and three output interconnects 824, 826 and 828 for three nominally equivalent data channels. Input interconnect 812 is coupled to the input of delay element 814 and a first input on guard gate 818. Interconnect 816 is coupled to the output of delay element 614 and a second input on guard gate 818.

Delay element 814 generates the second nominally equivalent logic signal on interconnect 816 in response to the first nominally equivalent logic signal on interconnect 812. When interconnect 812 transitions to logic-1 from logic-0 (or from logic-0 to logic-1), a transition from logic-1 to logic-0 (or from logic-0 to logic-1) will appear on interconnect 816 after the amount of time delay element 814 introduces. This means that the logic signals require the extra time necessary to propagate from the logic through delay element 814 and the guard gate 818 to the sequential element 830, and this extra delay degrades the timing performance of the circuit. However, due to the action of the guard gate 818, a transient signal of shorter duration than the delay of delay element 814 generated by a particle strike in the logic will not propagate to the sequential element 830. The signals on interconnects 812 and 816 are nominally equivalent because they each correspond to the same Boolean function. They are in different SET domains because they are generated by different circuits at different times and are separate entities with respect to SET events.

To create the three nominally equivalent data channels, the output of guard gate 818 is coupled to output interconnect 824, input interconnect 812 is coupled to output interconnect 828, and interconnect 816 is coupled to output interconnect 826. Output interconnects 824, 826 and 828 are coupled to the three data inputs of SEU mitigated sequential element 830. SEU mitigated sequential element 830 is an instance of SEU mitigated sequential element 630 of FIG. 6A and operates as described in conjunction with that drawing figure.

SET filter 810 can directly replace SET filter 610 (instances 704 and 710) in application 700 in FIG. 7A. This embodiment represents an area improvement over SET filter 610 of FIG. 6A since two of the three guard gates have been eliminated. Since SEU mitigated sequential element 830 (630) requires three nominally equivalent data channels in three separate SET domains, the signals on interconnects 812 and 816 can each replace a guard gate since they are nominally equivalent to each other and to the output of guard gate 818 and all three are generated from different circuits and are separate entities with respect to SET events.

Interconnects 812 and 816, delay element 814, and guard gate 818 behave like their analogs interconnects 612 and 616, delay element 614, and guard gate 618 in SET filter 610 in FIG. 6A. As long as an SET induced pulse generated on input interconnect 812 is shorter than the delay provided by delay element 814 the transient will not appear on the output of guard gate 818. An SET induced pulse of that short a duration will not change the output of delay element 814 either. Thus, while one of the sequential elements in SEU mitigated sequential element 830 (630) may receive an errant signal on interconnect 812, the TMR nature of the SEU mitigated sequential element 830 (630) will filter this out with the voting gate. It is worth noting that an SET induced pulse originating in delay element 814 or guard gate 818 will only affect at most one of the three data channels and be filtered out by SEU mitigated sequential element 830 (630), so a radiation strike in both these areas is accounted for.

Figure 8B:
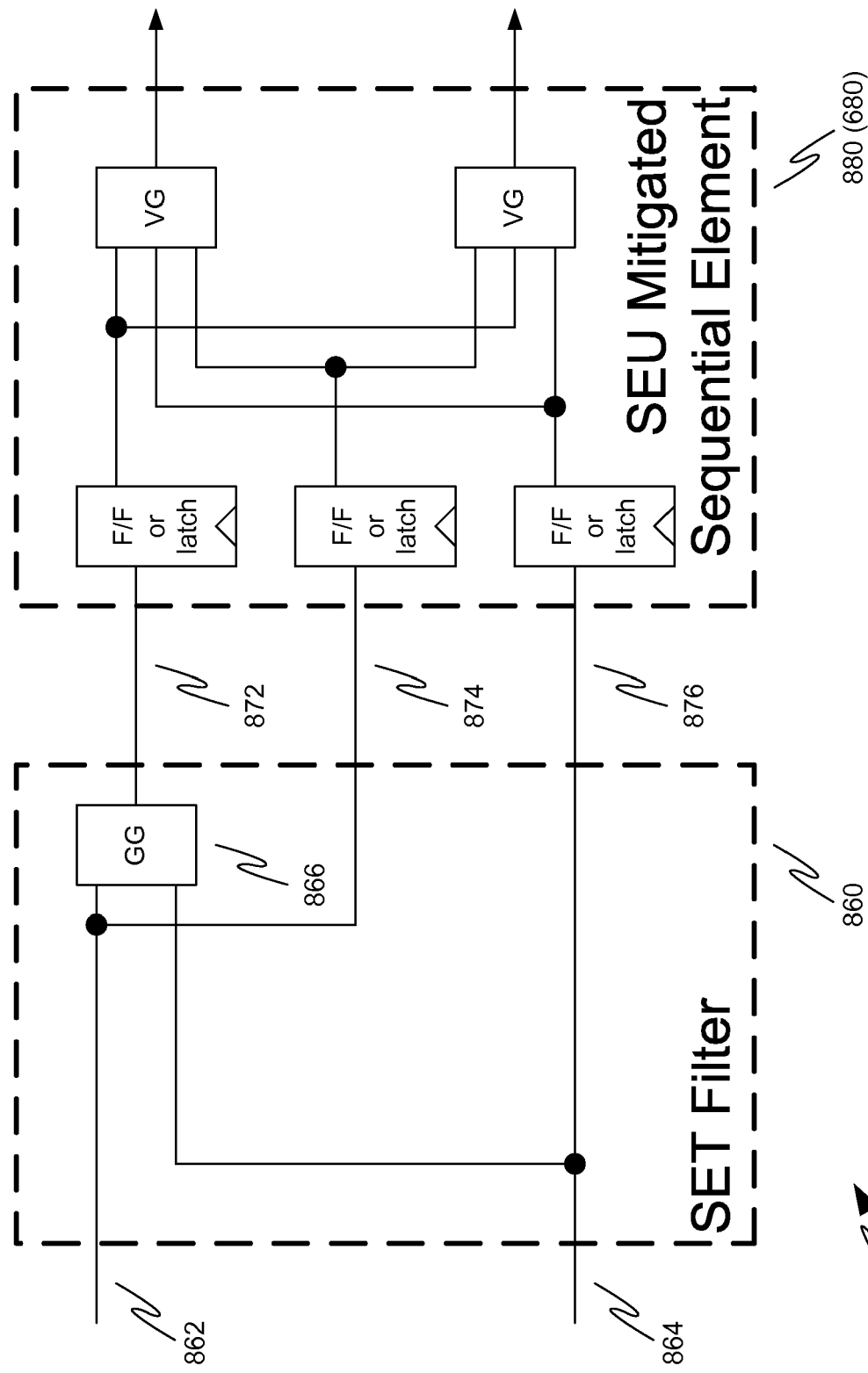

FIG. 8B shows, as generally indicated by reference number 850, a circuit comprising a fourth SET filter 860 and SEU mitigated sequential element 880 according to the present invention. SET filter 860 comprises input interconnects 862 and 864 for first and second nominally equivalent logic signals, a guard gate 866, and three output interconnects 872, 874 and 876 for three nominally equivalent data channels. Input interconnect 862 is coupled a first input on guard gate 866 and interconnect 864 is coupled to a second input on guard gate 866.

The two nominally equivalent logic signals on interconnects 862 and 864 are generated external to the SET filter 860 by duplicated logic circuits (not shown). Thus both interconnects 862 and 864 will transition to logic-1 from logic-0 (or from logic-0 to logic-1) at approximately the same time. This means that no extra time for a delay element is necessary as in SET filter 810. The logic signals on interconnects 662 and 664 are nominally equivalent because they each corresponds to the same Boolean function. They in different SET domains because they are generated by different logic circuits in different locations and are separate entities with respect to SET events.

To create the three nominally equivalent data channels, the output of guard gate 866 is coupled to output interconnects 872, input interconnect 862 is coupled to output interconnect 874, and input interconnect 864 is coupled to output interconnect 876. Output interconnects 872, 874 and 876 are coupled to the three data inputs of SEU mitigated sequential element 880. SEU mitigated sequential element 880 is an instance of SEU mitigated sequential element 680 of FIG. 6B and operates as described in conjunction with that drawing figure.

SET filter 860 can directly replace SET filter 660 (instances 754 and 760) in application 750 in FIG. 7B. This embodiment represents an area improvement over SET filter 660 of FIG. 6B since two of the three guard gates have been eliminated. Since SEU mitigated sequential element 880 (680) requires three nominally equivalent data channels in three separate SET domains, the signals on interconnects 862 and 864 can each replace a guard gate since they are nominally equivalent to the output of guard gate 866 and all three are generated from different circuits and are separate entities with respect to SET events.

Interconnects 862 and 864 and guard gate 866 behave like their analogs interconnects 662 and 664 and guard gate 666 in SET filter 660 in FIG. 6B. An SET induced pulse generated on either input interconnect 862 or input interconnect 864 will not appear on the output of guard gate 866. Thus, while one of the sequential elements in SEU mitigated sequential element 880 (680) may receive an errant signal on either input interconnect 862 or input interconnect 864, the function of guard gate 866 and the TMR nature of the SEU mitigated sequential element 830 (630) will filter this out. It is worth noting that an SET induced pulse originating guard gate 866 will only affect at most one of the three data channels and be filtered out by SEU mitigated sequential element 830 (630), so a radiation strike in this area is accounted for.

Figure 9:
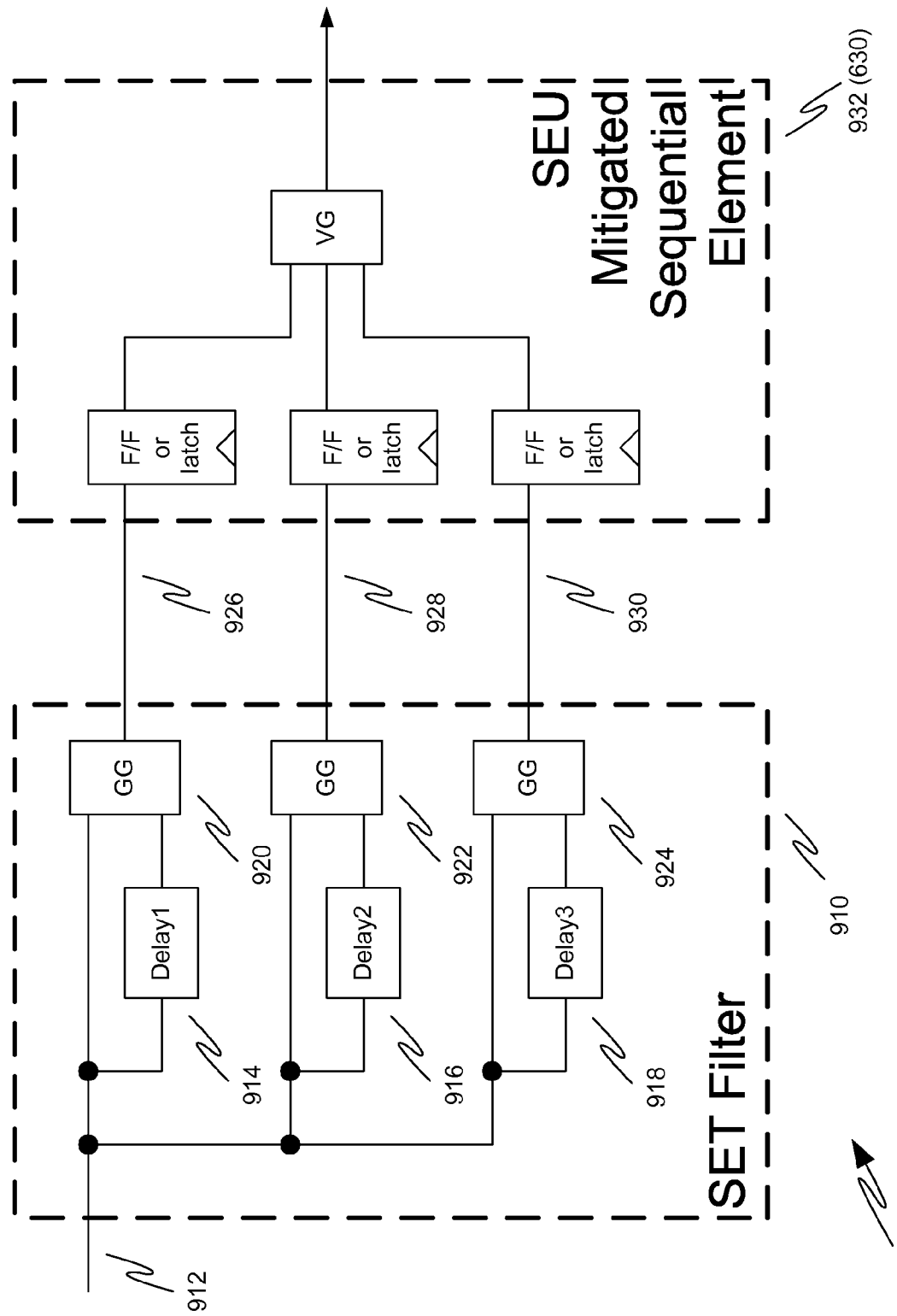

FIG. 9 shows, as generally indicated by reference number 900, a circuit comprising a fifth SET filter 910 and an SEU mitigated sequential element 932 according to the present invention. SET filter 910 comprises an input interconnect 912 for a first nominally equivalent logic signal, delay elements 914, 916 and 918, guard gates 920, 922 and 924, and three output interconnects 926, 928 and 930. Input interconnect 912 is coupled to the input of each of delay elements 914, 916 and 918, and a first input on each of the three guard gates 920, 922 and 924. The outputs of delay element 914, 916 and 918 is each coupled to a second input on one of the three guard gates 920, 922 and 924 respectively. The outputs of each of the three guard gates 920, 922 and 924 are coupled to output interconnects 926, 928 and 930 respectively creating three nominally equivalent data channels.

Delay element 914 generates a second nominally equivalent logic signal that is presented to the second input on guard gate 920. Delay element 916 generates a third nominally equivalent logic signal that is presented to the second input on guard gate 922. Delay element 918 generates a fourth nominally equivalent logic signal that is presented to the second input on guard gate 924. The first, second, third and fourth nominally equivalent logic signals are nominally equivalent because they each correspond to the same Boolean function and they are in different SET domains because they are generated by different circuits at different times and in different locations and are separate entities with respect to SET events.

Each guard gate 920, 922 and 924 operates like the guard gates 618, 620 and 622 in SET filter 610 in FIG. 6A, only with different timing based on the amount of delay in the delay lines 914, 916 and 918 that may provide one, two or three different amounts of delay as a matter of design choice. This is more robust than SET filter 610 of FIG. 6A because an SET induced pulse originating from a particle strike in one of delay elements 914, 916 or 918 (as well as in one of the guard gates 920, 922 or 924) will only affect at most one of the three data channels on interconnects 926, 928 and 930 and will be filtered out by SEU mitigated sequential element 630, so a radiation strike in both the guard gates and the delay lines is accounted for. SET filter 910 can directly replace SET filter 610 (instances 704 and 710) in the application 700 of FIG. 7A.

In general, the higher the energy level of a charged particle the longer an SET pulse it will produce in a given CMOS circuit. Persons of ordinary skill in the art will appreciate that the correct amount of delay to be provided by delay elements 914, 916 and 918 is a matter of design choice and will be a function of a number of factors like, for example, the semiconductor process employed, the radiation environment (i.e., the particle energy levels) in which an application is intended to be operated, and the expected duration of SET pulses generated in the device by the particle energies in that environment.

SEU mitigated sequential element 932 is an instance of SEU mitigated sequential element 630 of FIG. 6A. The circuit 900 mitigates both SET and SEU events. SET filter 910 generates three nominally equivalent data channels that are transmitted separately to the three sequential elements in SEU mitigated sequential element 932 (630), providing a complete SEE hardened solution for an output to a logic circuit. By replacing every sequential element in a design with circuit 900, the entire design is hardened against SEE.

Figure 3:
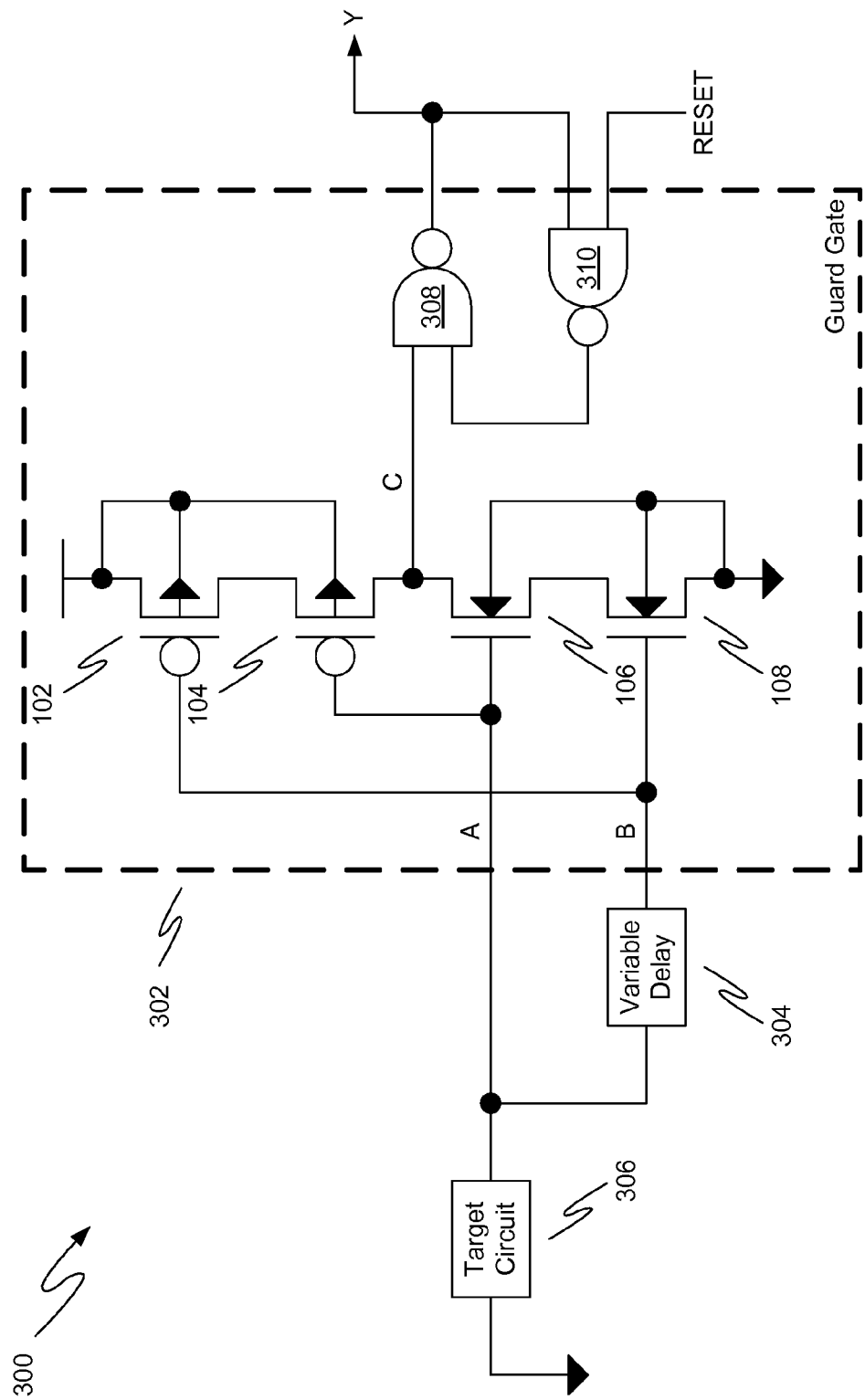
Figure 5:
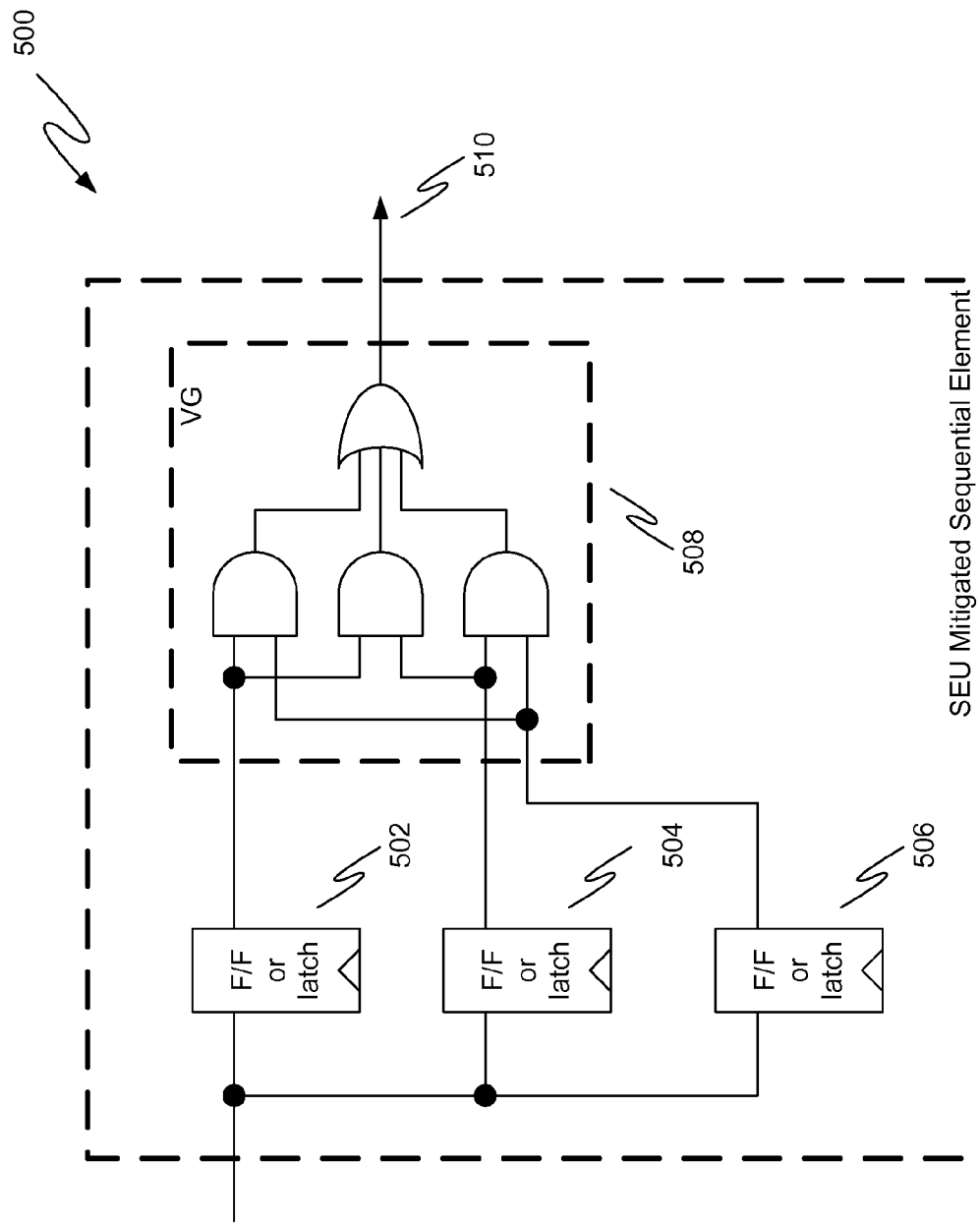

FIG. 10 shows, as generally indicated by reference number 1000, a circuit comprising a sixth SET filter and an SEU mitigated sequential element 1014 according to the present invention. SEU mitigated sequential element 1014 is an instance of prior art SEU mitigated sequential element 500 of FIG. 5. In the circuit 1000, nominally equivalent logic circuits 1010a and 1010b have their outputs coupled to interconnect 1012 that is coupled to the data input of SEU mitigated sequential element 1014 (500).

The SET filtering is accomplished by the analog summation of the outputs of the duplicated logic circuits 1010a and 1010b in interconnect 1012. If one of the two user logic paths receives a particle strike that generates an SET pulse, the two output drivers attempt to drive in opposite directions for the duration of the pulse. Due to the output capacitances and the balanced nature of the drivers, the output node will take some time to transition into an indefinite logic level. Transient pulses narrower than that time, will not be captured in SEU mitigated sequential element 1014.

FIG. 11 shows, as generally indicated by reference number 1100, a circuit comprising a seventh SET filter and an SEU mitigated sequential element 1114 according to the present invention. SEU mitigated sequential element 1114 is an instance of prior art SEU mitigated sequential element 500 of FIG. 5. In the circuit 1100, nominally equivalent logic circuits 1110a, 1110b and 1110c have their outputs coupled to interconnect 1112 that is coupled to the data input of SEU mitigated sequential element 1114 (500).

The SET filtering is accomplished by the analog summation of the outputs of the duplicated logic circuits 1110a, 1110b and 1110c in interconnect 1112. If one of the three duplicated logic circuits receives a particle strike that generates an SET pulse on its output, the other two outputs will continue driving in the correct direction for the duration of the pulse, preventing interconnect 1112 from getting to an indefinite logic level. This is a more robust version of the SET filter of FIG. 10, but with a higher cost since the user logic must be tripled.

Figure 12:
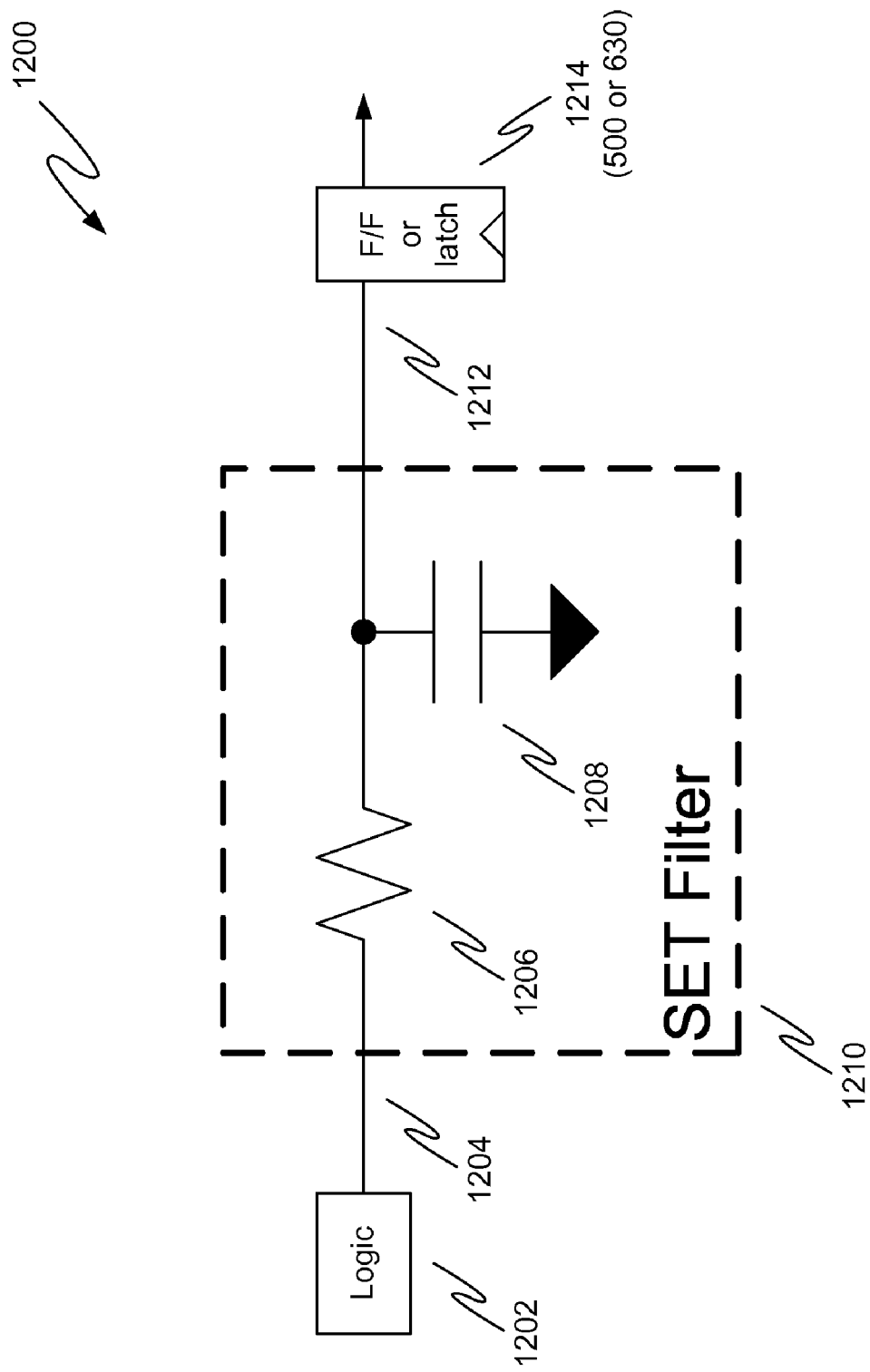

FIG. 12 shows, as generally indicated by reference number 1200, an eighth SET filter 1210 and SEU mitigated sequential element 1214 according to the present invention. FIG. 12 shows logic circuit 1202, interconnects 1204 and 1212, resistor 1206, capacitor 1208 and SEU mitigated element 1214 (that is an instance of prior art SEU mitigated sequential element 500 of FIG. 5). The output of logic circuit 1202 is coupled to a first terminal on resistor 1206 through interconnect 1204. Resistor 1206 has a second terminal coupled to a first terminal on capacitor 1208 and the data input of SEU mitigated sequential element 1214 through interconnect 1212. Capacitor 1208 has a second terminal coupled to ground.

The SET filter 1210 comprises resistor 1206 and capacitor 1208. For the most robust radiation hardening, this circuit can be built out of SET immune components such as a polysilicon resistor (for resistor 1206) and a MOSFET gate capacitor with the channel side grounded (for capacitor 1208). Both those component types do not generate carriers when irradiated the way conventional CMOS transistors do. The series resistor 1206 forms a low-pass filter with the output capacitor 1208. Thus wider pulses (meaning lower frequency signals—hence the "low" in "low pass" filter) like logic signals will pass through from the inputs to the output while narrower pulses (like some SET pulses) will not.

Figure 13A:
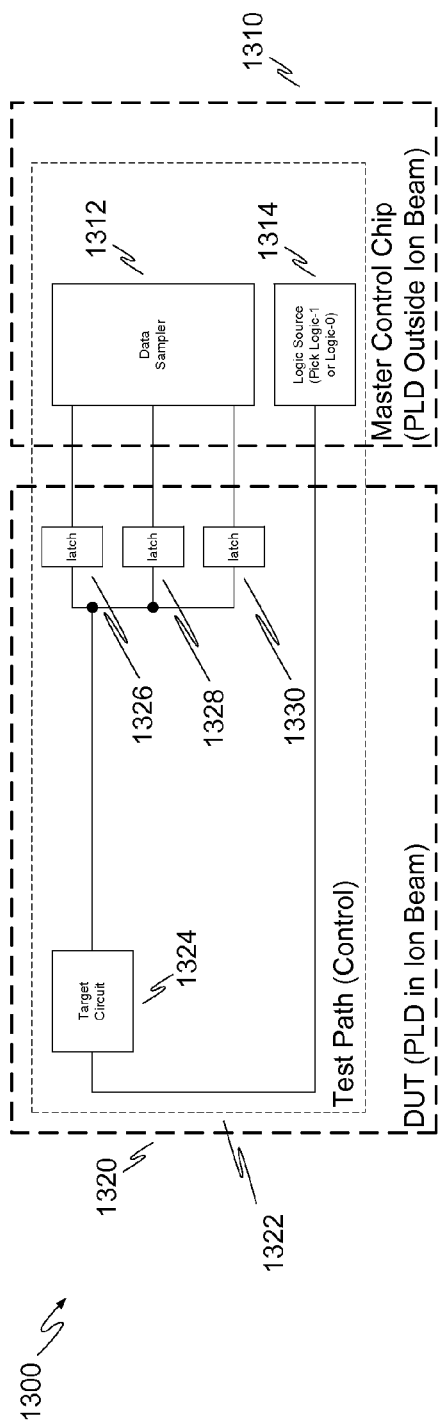

FIG. 13A shows, as generally indicated by reference number 1300, a first radiation test apparatus. Circuit 1300 comprises two separate integrated circuits, master control chip (MCC) 1310 and device under test (DUT) 1320, both indicated by heavy dashed lines. Integrated circuits 1310 and 1320 together comprise the two portions of test path 1322 indicated by a light dashed line. Test path 1322 spans both of the integrated circuits 1310 and 1320. Two integrated circuits are required so that one (DUT 1320) may be placed in a source of high radiation like an ion beam in a test chamber, while the other (MCC 1310) can remain outside the test chamber and function without being affected by radiation. The integrated circuits 1310 and 1320 are mounted or socketed on printed circuit boards that in turn are connected by cables that allow electrical signals to enter and exit the test chamber so that MCC 1310 can control DUT 1320 during radiation testing.

Master control chip 1310 comprises data sampler circuit 1312 and logic source 1314. Device under test 1320 comprises target circuit 1324 and latches 1326, 1328 and 1330. Target circuit 1324 is a delay line preferably comprised of inverting delay elements, though other circuits may be used. Latches 1326, 1328 and 1330 are preferably SEU mitigated like circuit 500 in FIG. 5 though this is optional.

Test path 1322 is a control element with no SET mitigation circuitry for purposes of providing a reference against which the test performance of various mitigation schemes can be compared. The latches 1326, 1328 and 1330 have various control signals not shown that are driven from either data sampler circuit 1312 or some other circuit on MCC 1310 not shown. These signals are omitted to avoid overcomplicating the figure and obscuring the inventive elements therein. Persons skilled in the art will appreciate that there are many ways to implement the circuitry in test path 1322 and that the approach taken in a practical implementation is a matter of design choice.

Figure 13B:
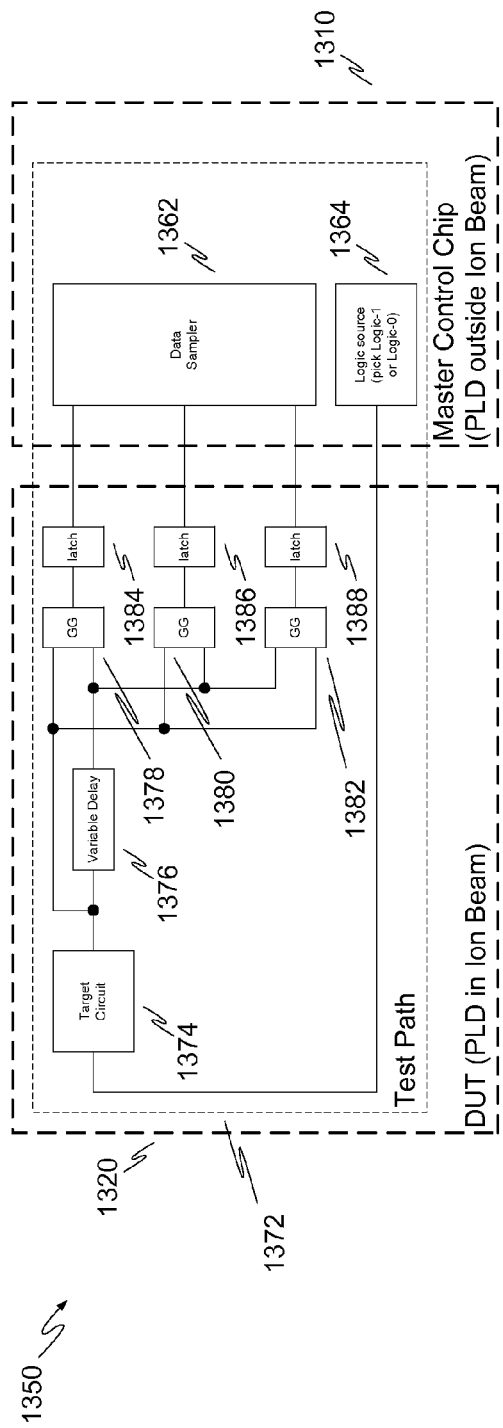

FIG. 13B shows, as generally indicated by reference number 1350, a second radiation test apparatus. Circuit 1300 comprises two separate integrated circuits, master control chip (MCC) 1310 and device under test (DUT) 1320, both indicated by heavy dashed lines, previously discussed in conjunction with FIG. 13A. Integrated circuits 1310 and 1320 together further comprise the two portions of test path 1372 indicated by a light dashed line. Test path 1372 spans both of the integrated circuits 1310 and 1320. Two integrated circuits are required so that one (DUT 1320) may be placed in a source of high radiation like an ion beam in a test chamber, while the other (MCC 1310) can remain outside the test chamber and function without being affected by radiation. The integrated circuits 1310 and 1320 are mounted or socketed on printed circuit boards that in turn are connected by cables that allow electrical signals to enter and exit the test chamber so that MCC 1310 can control DUT 1320 during radiation testing.

Master control chip 1310 comprises data sampler circuit 1362 and logic source 1364. Device under test 1320 comprises target circuit 1374, variable delay 1376, guard gates 1378, 1380 and 1382, and latches 1384, 1386 and 1388. Target circuit 1324 is a delay line preferably comprised of inverting delay elements, though other circuits may be used. Variable delay 1376 and guard gates 1378, 1380 and 1382 comprise an SET filter. Latches 1326, 1328 and 1330 are preferably SEU mitigated like circuit 500 in FIG. 5 though this is optional.

Test path 1372 is a test element where an SET filter is included to mitigate against SET effects for purposes of providing an understanding of the effectiveness of the SET filtering relative to the control design. Ideally, test path 1322 and 1372 would be placed on the same integrated circuits (MCC 1310 and DUT 1320) and irradiated together. It should be noted that while variable delay 1376 and guard gates 1378, 1380 and 1382 implement an instance of SET filter 610 of FIG. 6, test path 1372 could be constructed differently to test the effectiveness of any of the SET filters of the present invention and that the choice of SET filter 610 in FIG. 13B is illustrative only and in no way limiting.

The latches 1384, 1386 and 1388 have various control signals not shown that are driven from either data sampler circuit 1312 or some other circuit on MCC 1310 (not shown). These signals are omitted to avoid overcomplicating the figure and obscuring the inventive elements therein. Persons skilled in the art will appreciate that there are many ways to implement the circuitry in test path 1372 and that the approach taken in a practical implementation is a matter of design choice.

Figure 13C:
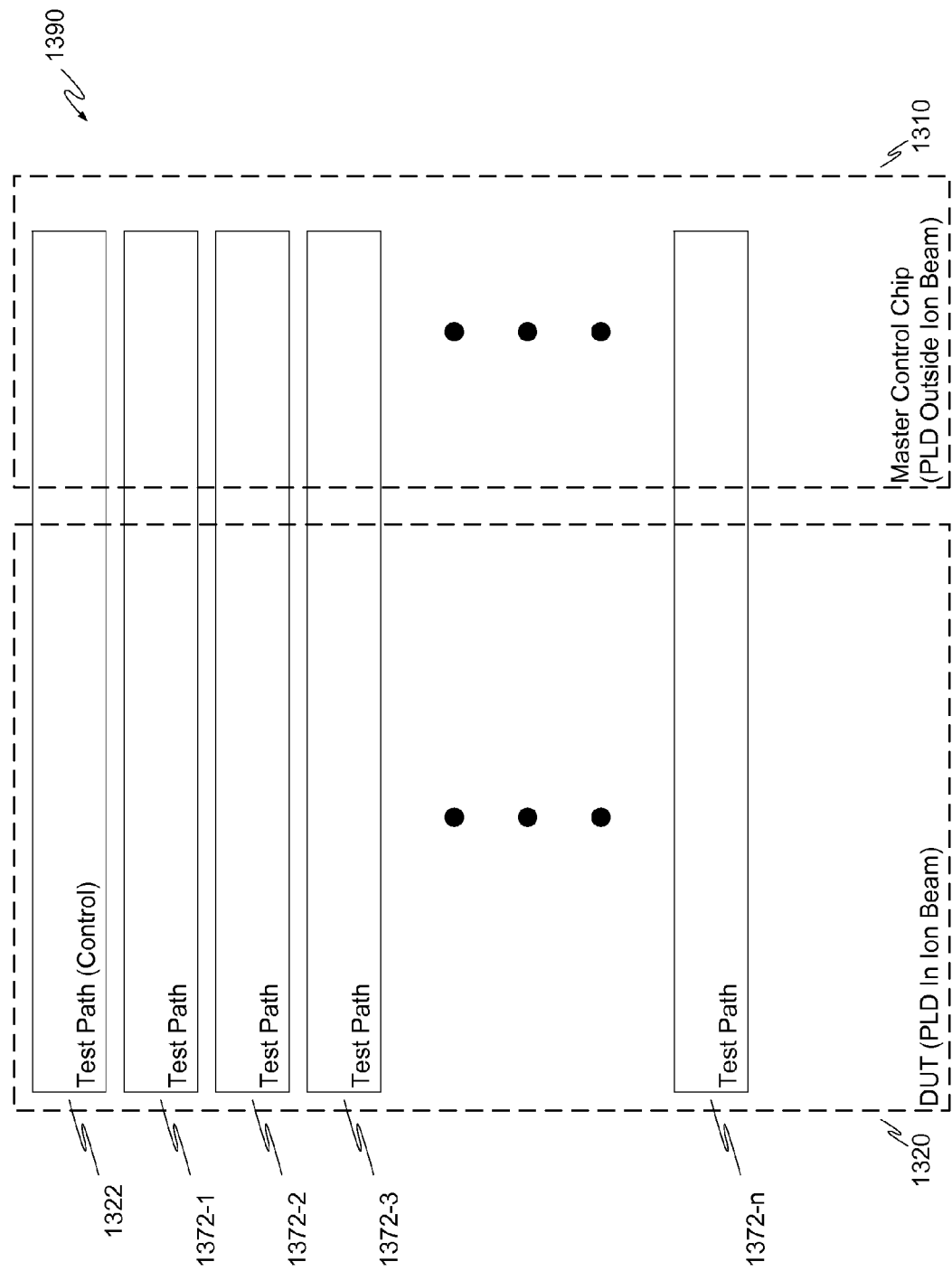

FIG. 13C shows, as generally indicated by reference number 1390, a third radiation test apparatus. Circuit 1390 comprises two separate integrated circuits, master control chip (MCC) 1310 and device under test (DUT) 1320, both indicated by heavy dashed lines, previously discussed in conjunction with FIG. 13A. Integrated circuits 1310 and 1320 together further comprise the two portions of test paths 1322, 1372-1, 1372-2, 1372-3 and so on through 1372-n. Each of the test paths 1322 and 1372-1 through 1372-n spans both of the integrated circuits 1310 and 1320 as shown in FIG. 13A and FIG. 13B respectively.

Two integrated circuits are required so that one (DUT 1320) may be placed in a source of high radiation like an ion beam in a test chamber, while the other (MCC 1310) can remain outside the test chamber and function without being affected by radiation. The integrated circuits 1310 and 1320 are mounted on printed circuit boards that in turn are connected by cables that allow electrical signals to enter and exit the test chamber so that MCC 1310 can control DUT 1320 during radiation testing.

The integrated circuits 1310 and 1320 are preferably implemented using non-volatile programmable logic devices. Although integrated circuits 1310 and 1320 can be constructed using an ASIC or with a fully custom methodology, such an approach can be very costly in terms of time delay (it takes a long time to design and fabricate an integrated circuit in a modern process) as well both design and fabrication costs. Similarly, use of a volatile (SRAM based) PLD is possible, but the issue of SEU strikes involving the configuration SRAM bits must be accounted for in both the experiment and the interpretation of the data. Use of a non-volatile PLD allows experimenters to use off-the-shelf products like PLDs for the test and control designs and customize them using off-the-shelf design tools (the design software produced by PLD manufacturers). The PLD used may be a commercial part and does not need to be a special radiation hardened circuit. The biggest limitation to this approach is that the experimenter may be restricted to the design elements available in the design software and is certainly limited by the programmable elements and control elements physically present in the PLD.

The methodology of using a PLD for integrated circuits allows the experimenters considerable flexibility. For example, in test circuit 1390 the test paths 1372-1 through 1372-n can be used to evaluate the effectiveness of a number of different SET filters relative to the control test path 1322. Or the test paths 1372-1 through 1372-n can be used to evaluate the effectiveness of a number of different instances of the same SET filter with differing values of delay element like, for example, variable delay 1376 in FIG. 13B, relative to the control test path 1322. Multiple instances of the same test design can be used to gather more data for statistical purposes. Of particular value is the use of the PLD as a characterization vehicle for itself to determine the best method for making a commercial PLD radiation hard without the need to completely redesign the PLD.

Figure 14A:
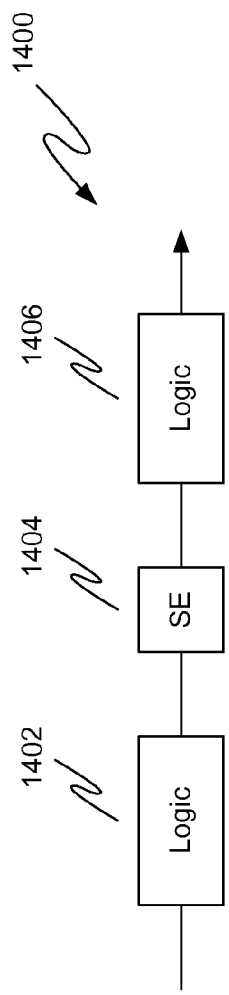
FIG. 14A shows an unmitigated first portion of an end user logic design.

FIG. 14A shows, as generally indicated by reference number 1400, an unmitigated first portion of an end user logic design as it might appear in a schematic entry tool in the design software of a commercial PLD. The design comprises a first logic circuit 1402, sequential element 1404 and a second logic circuit 1406. In the most general case, logic circuits 1402 and 1406 would implement different Boolean functions (except by coincidence) and would typically have multiple inputs and frequently multiple outputs as well. As someone of ordinary skill in the art will appreciate, in the general case of multiple inputs and outputs each input should be treated identically with all the other inputs and each output should be treated identically with all the other outputs for purposes of SEE mitigation. Such skilled persons will also realize that the sequential element 1404 is used to control the timing of the circuit and it will have one or more control signals not shown in FIG. 14A.

Figure 14B:
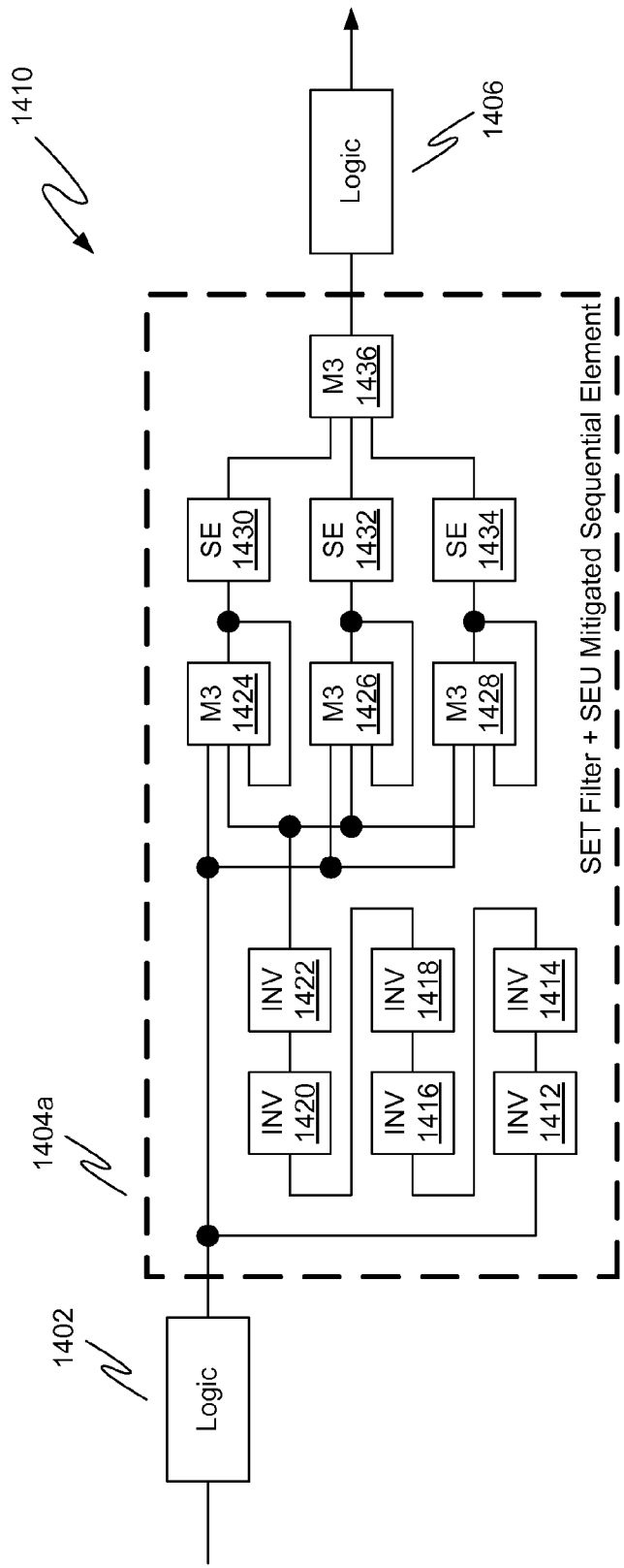
FIG. 14B shows an SET and SEU mitigated version of the portion of the end user logic design of FIG. 14A.

FIG. 14B shows, as generally indicated by reference number 1410, an SET and SEU mitigated version of the portion of the end user logic design of FIG. 14A. Logic circuits 1402 and 1406 remain unchanged while sequential element 1404 is replaced by sequential element 1404a, that includes an implementation of SET filter 610 and SEU mitigated sequential element 630 of FIG. 6A.

In a commercial application, sequential element 1404 would typically be implemented by a single logic module or similar design element. In FIG. 14B, to produce a radiation hardened design sequential element 1404a implements the same logical functionality as sequential element 1404, but using 13 different logic modules or similar design elements. In the implementation of SET filter 610, delay element 614 is shown implemented using six logic modules 1412, 1414, 1416, 1418, 1420 and 1422 in a series arrangement configured as logical inverters (INV) and the guard gates 618, 620 and 622 are implemented using three logic modules 1424, 1426 and 1428 configured as majority-of-3 voting gates (M3) with the output fed back to one of the inputs like in guard gate 200 of FIG. 2. In the implementation of SEU mitigated sequential element 630, three logic modules 1430, 1432 and 1434 are configured as the same sequential element function as sequential element 1404 of FIG. 14A with their data inputs coupled to the three guard gates and their outputs coupled to a logic module 1436 configured as a voting gate (M3). This approach is highly desirable because it is relatively easy to implement a radiation tolerant library of design elements that is virtually identical to the commercial library except for the one-for-one substitution of a SEE mitigated subcircuit like 1404a for each sequential element like sequential element 1404.

Figure 14C:
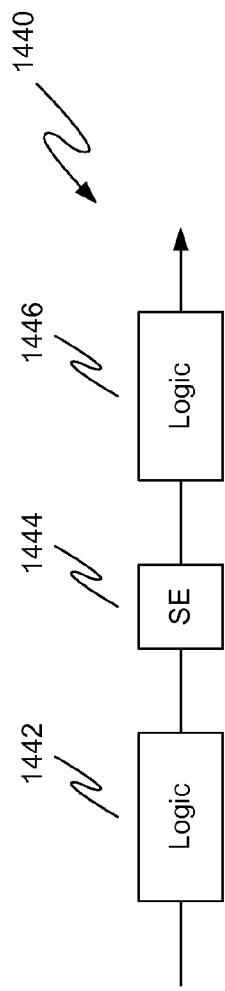
FIG. 14C shows an unmitigated second portion of an end user logic design.

FIG. 14C shows, as generally indicated by reference number 1440, an unmitigated second portion of an end user logic design as it might appear in a schematic entry tool in the design software of a commercial PLD. The design comprises a first logic circuit 1442, sequential element 1444 and a second logic circuit 1446. In the most general case, logic circuits 1402 and 1406 would implement different Boolean functions (except by coincidence) and would typically have multiple inputs and frequently multiple outputs as well. As someone of ordinary skill in the art will appreciate, in the general case of multiple inputs and outputs each input should be treated identically with all the other inputs and each output should be treated identically with all the other outputs for purposes of SEE mitigation. Such skilled persons will also realize that the sequential element 1444 is used to control the timing of the circuit and it will have one or more control signals not shown in FIG. 14C.

Figure 14D:
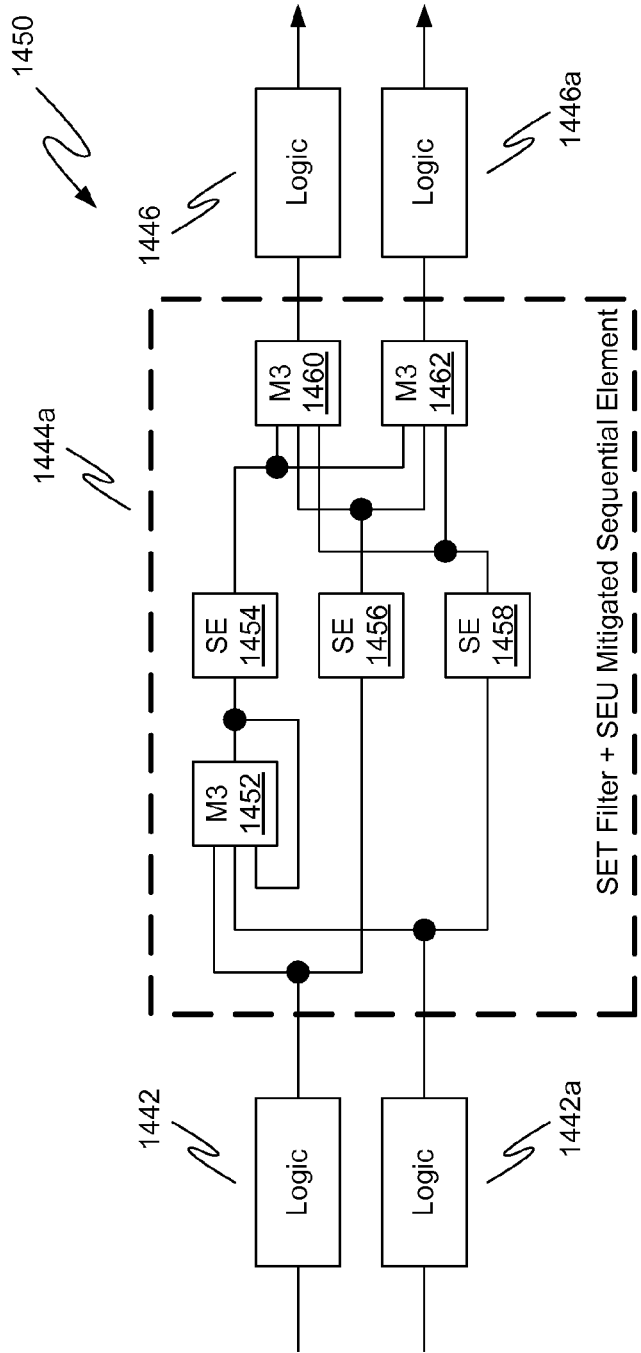
FIG. 14D shows an SET and SEU mitigated version of the portion of the end user logic design of FIG. 14C.

FIG. 14D shows, as generally indicated by reference number 1450, an SET and SEU mitigated version of the portion of the end user logic design of FIG. 14C. Logic circuits 1442 and 1446, though unchanged, are duplicated by the addition of logic circuits 1442a and 1446a respectively while sequential element 1444 is replaced by sequential element 1444a, that includes an implementation of SET filter 860 of FIG. 8B and SEU mitigated sequential element 680 of FIG. 6B.

In a commercial application, sequential element 1444 would typically be implemented by a single logic module or similar design element. In FIG. 14D, to produce a radiation hardened design sequential element 1444a implements the same logical functionality as sequential element 1444, but using five different logic modules or similar design elements. In the implementation of SET filter 680, guard gates 866 is implemented using a logic module 1452 configured as majority-of-3 voting gates (M3) with the output fed back to one of the inputs like in guard gate 200 of FIG. 2. In the implementation of SEU mitigated sequential element 680, three logic modules 1454, 1456 and 1458 are configured as the same sequential element function as sequential element 1444 of FIG. 14C with their data inputs coupled to guard gate 1452 and the outputs of logic circuits 1442 and 1442a, while their outputs are coupled to two logic modules 1460 and 1462 configured as a voting gates (M3). This approach is harder to implement since it involves changes to the whole design rather than only on the library cells of a sequential element such as a flip/flop or latch as was the case in FIG. 14B.

So far the discussion of SET filters and SEU mitigated sequential elements has been restricted to the data path. All sequential elements have one or more control signals that also need to be hardened to avoid unwanted changes in the contents of the sequential element. Sometimes these signals can be mitigated on a global bases, like, for example, a clock or resent going to a large portion of an end user's design since a large global driver will generally be strong enough to supply the current necessary to successfully resist the current demands of the worst case field funnel in most radiation environments. Other times the mitigation must be done locally like, for example, in the case of a small local region consisting of just a few sequential elements not using a global resource for any of its control signals.

FIG. 15A shows, as generally indicated by reference number 1500, a first SET mitigated clocking scheme comprising SET filter 610 and SEU mitigated sequential element 630 of FIG. 6A and clock line 1502 driven by a clock source not shown. Using a single clock from a hardened clock source (i.e., designed to not produce clock glitches due to SET events) is known in the art. This is an example of an approach that works well on a global level where the cost of hardening the clock source can be amortized over many sequential elements.

FIG. 15B shows, as generally indicated by reference number 1510, a second SET mitigated clocking scheme comprising SET filter 610 and SEU mitigated sequential element 630 of FIG. 6A and clock lines 1512, 1514 and 1516 driven by three different clock sources not shown, effectively taking a TMR approach to the clock distribution. Using TMRed clocks is known in the art. This is an example of an approach that works well on both a global level or a local level, though the cost of tripling the clock sources is typically less when operating on a global level, again due to amortization over a large number of elements. When TMRing the clocks, each individual clock network does not need to be SET mitigated per se, as long as the physical elements are separated in a manner to avoid double strikes.

FIG. 15C shows, as generally indicated by reference number 1520, a third SET mitigated clocking scheme comprising an implementation of SET filter 610 on both the data and clocking paths of SEU mitigated sequential element 630 of FIG. 6A. The clock mitigation SET filter comprises clock line 1522, delay element 1524, interconnect 1526 and guard gates 1528, 1530 and 1532. Clock line 1522 is for a first nominally equivalent clock in a first SET domain. Delay element 1524 creates a second nominally equivalent clock in a second SET domain on interconnect 1526. Both clock line 1522 and interconnect 1526 are coupled to the inputs of the guard gates 1528, 1530 and 1532, while the outputs of the guard gates 1528, 1530 and 1532 are coupled to the clock inputs of sequential elements 632, 634 and 636 respectively. Like the SET filters described with respect to the data paths, the SET filter of FIG. 15C has two nominally equivalent clock signals in two different SET domains that get converted into three nominally equivalent clock channels.

FIG. 15D shows, as generally indicated by reference number 1540, a fourth SET mitigated clocking scheme comprising an implementation of SET filter 610 and SEU mitigated sequential element 630 of FIG. 6A. In circuit 1540, SET filter 660 of FIG. 6B is used in the clocking path. The clock mitigation SET filter comprises clock lines 1542 and 1544, and guard gates 1546, 1548 and 1550. Clock lines 1542 and 1544 are for first and second nominally equivalent clock signals in first and second SET domains. Both clock lines 1542 and 1544 are coupled to the inputs of the guard gates 1546, 1548 and 1550, while the outputs of the guard gates 1546, 1548 and 1550 are coupled to the clock inputs of sequential elements 632, 634 and 636 respectively. Like the SET filters described with respect to the data paths, the SET filter of FIG. 15D has two nominally equivalent clock signals in two different SET domains that get converted into three nominally equivalent clock channels.

It is worth noting that two different styles of SET filter are present in FIG. 15D. A delay type SET filter is used in the data path while a logic duplication SET filter is used in the clock path. Thus it is possible for the design software to analyze a circuit and determine the most economical approach for each signal in a design and apply the appropriate SET filter for each signal.

Persons skilled in the art will realize that SET mitigation is required on all sequential element control signals, like for example, gate signals, enable signals, synchronous set and reset signals, asynchronous set and reset signals, data load signals, etc., for a complete radiation hard solution. Such skilled persons will also realize that any of the SET filters described for use in the data path could also be used to mitigate the various control signals that might be present on a particular sequential element.

While embodiments and applications of this invention have been shown and described, it would be apparent to those skilled in the art that many more modifications than mentioned above are possible without departing from the inventive concepts herein. The invention, therefore, is not to be restricted except in the spirit of the appended claims.

What is claimed is:

1. A method for single event transient filtering in an integrated circuit device, the device comprising first, second, and third sequential elements, each sequential element having a data input and a data output, and the device further comprising a first voting gate with first, second and third inputs, wherein the data output of the first sequential element is coupled to the first input of the first voting gate, the data output of the second sequential element is coupled to the second input of the first voting gate, and the data output of the third sequential element is coupled to the third input of the first voting gate, the method comprising the steps of:
   (a) generating first and second nominally equivalent logic signals in first and second SET domains;
   (b) converting the first and second nominally equivalent logic signals into first, second and third nominally equivalent data channels; and
   (c) transmitting the first, second and third nominally equivalent data channels to the data inputs of the first, second and third sequential elements respectively.

2. The method recited in claim 1, wherein:
   (a) the integrated circuit device further comprises a first delay element having an input and an output;
   (b) the first nominally equivalent logic signal is coupled to the input of the first delay element; and
   (c) the second nominally equivalent logic signal is coupled to the output of the first delay element.

3. The method recited in claim 2, wherein the integrated circuit device further comprises a first guard gate having:
   (a) a first input coupled to the first nominally equivalent logic signal,
   (b) a second input coupled to the second nominally equivalent logic signal, and
   (c) an output coupled to the first nominally equivalent data channel.

4. The method recited in claim 3, wherein the integrated circuit device further comprises a second guard gate having:
   (a) a first input coupled to the first nominally equivalent logic signal,
   (b) a second input coupled to the second nominally equivalent logic signal, and
   (c) an output coupled to the second nominally equivalent data channel.

5. The method recited in claim 4, wherein the integrated circuit device further comprises a third guard gate having:
   (a) a first input coupled to the first nominally equivalent logic signal,
   (b) a second input coupled to the second nominally equivalent logic signal, and
   (c) an output coupled to the third nominally equivalent data channel.

6. The method recited in claim 3, wherein:
   (a) the first nominally equivalent logic signal is coupled to the second nominally equivalent data channel; and
   (b) the second nominally equivalent logic signal is coupled to the third nominally equivalent data channel.

7. The method recited in claim 3, wherein the integrated circuit device further comprises:
   (a) a third nominally equivalent logic signal in a third SET domain;
   (b) a second delay element having an input and an output, wherein:
      (i) the first nominally equivalent logic signal is coupled to the input of the second delay element; and
      (ii) the third nominally equivalent logic signal is coupled to the output of the second delay element; and
   (c) a second guard gate having:
      (i) a first input coupled to the first nominally equivalent logic signal,
      (ii) a second input coupled to the third nominally equivalent logic signal, and
      (iii) an output coupled to the second nominally equivalent data channel.

8. The method recited in claim 7, wherein the integrated circuit device further comprises:
   (a) a fourth nominally equivalent logic signal in a fourth SET domain;
   (b) a third delay element having an input and an output, wherein:
      (i) the first nominally equivalent logic signal is coupled to the input of the third delay element; and
      (ii) the fourth nominally equivalent logic signal is coupled to the output of the first third element; and (c) a third guard gate having:
  (i) a first input coupled to the first nominally equivalent logic signal,
  (ii) a second input coupled to the fourth nominally equivalent logic signal, and
  (iii) an output coupled to the third nominally equivalent data channel.

9. The method recited in claim 1, wherein:
(a) the integrated circuit device is a programmable logic device; and
(b) each sequential element comprises at least one programmable element.

10. The method recited in claim 5, wherein:
(a) the integrated circuit device is a programmable logic device;
(b) each sequential element comprises at least one programmable element; and
(c) the first delay element comprises at least one programmable element.

11. The method recited in claim 6, wherein:
(a) the integrated circuit device is a programmable logic device;
(b) each sequential element comprises at least one programmable element; and
(c) the first delay element comprises at least one programmable element.

12. The method recited in claim 8, wherein:
(a) the integrated circuit device is a programmable logic device;
(b) each sequential element comprises at least one programmable element; and
(c) the first delay element comprises at least one programmable element.

13. The method recited in claim 1, wherein:
(a) the integrated circuit device further comprises first and second logic circuits producing nominally equivalent logic functions, each logic circuit having an input and an output;
(b) the first nominally equivalent logic signal is coupled to the output of the first logic circuit; and
(c) the second nominally equivalent logic signal is coupled to the output of the second logic circuit.

14. The method recited in claim 13, wherein the integrated circuit device further comprises a first guard gate having:
(a) a first input coupled to the first nominally equivalent logic signal,
(b) a second input coupled to the second nominally equivalent logic signal, and
(c) an output coupled to the first nominally equivalent data channel.

15. The method recited in claim 14, wherein:
(a) the first nominally equivalent logic signal is coupled to the second nominally equivalent data channel; and
(b) the second nominally equivalent logic signal is coupled to the third nominally equivalent data channel.

16. The method recited in claim 14, wherein the integrated circuit device further comprises a second guard gate having:
(a) a first input coupled to the first nominally equivalent logic signal,
(b) a second input coupled to the second nominally equivalent logic signal, and
(c) an output coupled to the second nominally equivalent data channel.

17. The method recited in claim 15, wherein the integrated circuit device further comprises a third guard gate having:
(a) a first input coupled to the first nominally equivalent logic signal,
(b) a second input coupled to the second nominally equivalent logic signal, and
(c) an output coupled to the third nominally equivalent data channel.

18. The method recited in claim 13, wherein the integrated circuit device further comprises:
(a) fourth, fifth and sixth sequential elements, each sequential element having a data input and a data output;
(b) second and third voting gates, each voting gate with first, second and third inputs and an output, wherein:
  (i) the data output of the fourth sequential element is coupled to the first input of the second voting gate and the first input of the third voting gate,
  (ii) the data output of the fifth sequential element is coupled to the second input of the second voting gate and the second input of the third voting gate,
  (iii) the data output of the sixth sequential element is coupled to the third input of the second voting gate and the third input of the third voting gate,
  (iv) the output of the second voting gate is coupled to the input of the first logic circuit, and
  (v) the output of the third voting gate is coupled to the input of the second logic circuit.

19. The method recited in claim 18, wherein:
(a) the integrated circuit device is a programmable logic device;
(b) the first, second and third sequential elements each comprises at least one programmable element; and
(c) the first and second logic circuits each comprises at least one programmable element.

20. The method recited in claim 15, wherein the integrated circuit device further comprises:
(a) fourth, fifth and sixth sequential elements, each sequential element having a data input and a data output;
(b) second and third voting gates, each voting gate with first, second and third inputs and an output, wherein:
  (i) the data output of the fourth sequential element is coupled to the first input of the second voting gate and the first input of the third voting gate,
  (ii) the data output of the fifth sequential element is coupled to the second input of the second voting gate and the second input of the third voting gate,
  (iii) the data output of the sixth sequential element is coupled to the third input of the second voting gate and the third input of the third voting gate,
  (iv) the output of the second voting gate is coupled to the input of the first logic circuit, and
  (v) the output of the third voting gate is coupled to the input of the second logic circuit.

21. The method recited in claim 20, wherein:
(a) the integrated circuit device is a programmable logic device;
(b) the first, second and third sequential elements each comprises at least one programmable element; and
(c) the first and second logic circuits each comprises at least one programmable element.

22. The method recited in claim 17, wherein the integrated circuit device further comprises:
(a) fourth, fifth and sixth sequential elements, each sequential element having a data input and a data output;
(b) second and third voting gates, each voting gate with first, second and third inputs and an output, wherein:
  (i) the data output of the fourth sequential element is coupled to the first input of the second voting gate and the first input of the third voting gate, (ii) the data output of the fifth sequential element is coupled to the second input of the second voting gate and the second input of the third voting gate,
(iii) the data output of the sixth sequential element is coupled to the third input of the second voting gate and the third input of the third voting gate,
(iv) the output of the second voting gate is coupled to the input of the first logic circuit, and
(v) the output of the third voting gate is coupled to the input of the second logic circuit.

23. The method recited in claim 22, wherein:
(a) the integrated circuit device is a programmable logic device;
(b) the first, second and third sequential elements each comprises at least one programmable element; and
(c) the first and second logic circuits each comprises at least one programmable element.

* * * * *